(12) United States Patent
Ishitani

(10) Patent No.: US 11,997,796 B2
(45) Date of Patent: May 28, 2024

(54) WORK DEVICE

(71) Applicant: Panasonic Intellectual Property Management Co., Ltd., Osaka (JP)

(72) Inventor: Yasuyuki Ishitani, Yamanashi (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 800 days.

(21) Appl. No.: 17/057,293

(22) PCT Filed: Aug. 2, 2019

(86) PCT No.: PCT/JP2019/030385
§ 371 (c)(1),
(2) Date: Nov. 20, 2020

(87) PCT Pub. No.: WO2020/059319
PCT Pub. Date: Mar. 26, 2020

(65) Prior Publication Data
US 2021/0187677 A1  Jun. 24, 2021

(30) Foreign Application Priority Data

Sep. 20, 2018  (JP) ................................. 2018-175512

(51) Int. Cl.
*H05K 13/08* (2006.01)
(52) U.S. Cl.
CPC .................................... *H05K 13/08* (2013.01)
(58) Field of Classification Search
CPC ... H05K 13/08; H05K 13/086; H05K 13/0419
See application file for complete search history.

(56) References Cited

U.S. PATENT DOCUMENTS

| 9,669,980 B2* | 6/2017 | Koyanagi ............ H05K 13/046 |
| 10,925,200 B2* | 2/2021 | Iisaka ................ H05K 13/0452 |
| 2009/0065149 A1* | 3/2009 | Yamasaki .......... H05K 13/0417 |
| | | 156/353 |
| 2016/0086790 A1 | 3/2016 | Maenishi et al. |
| 2016/0366797 A1* | 12/2016 | Sumi .................. H05K 13/0857 |

(Continued)

FOREIGN PATENT DOCUMENTS

| JP | 2016-063116 | 4/2016 |
| WO | 2017/130345 | 8/2017 |

OTHER PUBLICATIONS

International Search Report of PCT application No. PCT/JP2019/030385 dated Oct. 8, 2019.

*Primary Examiner* — Jeffrey T Carley
*Assistant Examiner* — Jose K Abraham
(74) *Attorney, Agent, or Firm* — PEARNE & GORDON LLP

(57) ABSTRACT

A work device includes a main body, a connector part, a guide, and a data transmitter. The connector part, the guide, and the data transmitter are provided in the main body. The connector part is configured to be fitted to a connector of the feeder carriage. The guide guides the feeder carriage so that the connector is fitted to the connector part when the feeder carriage is brought close to the main body while making the connector face the connector part. The data transmitter transmits data to the feeder carriage through the connector when the connector is fitted with the connector part.

6 Claims, 19 Drawing Sheets

(56) References Cited

U.S. PATENT DOCUMENTS

2017/0245407 A1* 8/2017 Takanami .......... H05K 13/0417
2017/0339807 A1* 11/2017 Tanaka ............... H05K 13/0417
2018/0146581 A1* 5/2018 Ohashi ................... H05K 13/08

* cited by examiner

WORK DEVICE

CROSS-REFERENCE TO RELATED APPLICATIONS

This application is a U.S. national stage application of the PCT International Application No. PCT/JP2019/030385 filed on Aug. 2, 2019, which claims the benefit of foreign priority of Japanese patent application No. 2018-175512 filed on Sep. 20, 2018, the contents all of which are incorporated herein by reference.

TECHNICAL FIELD

The present disclosure relates to a work device that transmits data to a feeder carriage through a connector of the feeder carriage.

BACKGROUND ART

Conventionally, a component mounter that mounts a component on a board to manufacture a mounting board is known. A parts feeder that supplies a component to such a component mounter is installed on a feeder carriage used as a support base for the parts feeder, and the feeder carriage is moved on a floor surface to be connected to a base of the component mounter. Operation contents of the parts feeder are determined for each mounting board to be manufactured by the component mounter, and work data as data defining the operation contents is stored in advance in a memory of the feeder carriage or the parts feeder. In a case where the work data of the parts feeder is stored in the memory, the feeder carriage and a data management device are electrically connected to each other, and then the data is transmitted from the data management device to the memory (for example, refer to PTL 1).

CITATION LIST

Patent Literature

PTL 1: Japanese Patent Unexamined Publication No. 2016-63116

SUMMARY OF THE INVENTION

However, in the above-described data transmission work, the work of connecting a connector of the feeder carriage and a connector of the data management device to each other needs to be manually performed by a worker, resulting in poor workability.

The present disclosure provides a work device capable of improving workability of data transmission work for transmitting data to a feeder carriage.

The work device of the present disclosure includes a main body, a connector part, a guide, and a data transmitter. The connector part, the guide, and the data transmitter are provided in the main body. The connector part is configured to be fitted to a connector of the feeder carriage. The guide guides the feeder carriage so that the connector is fitted to the connector part when the feeder carriage is brought close to the main body while making the connector face the connector part. The data transmitter transmits data to the feeder carriage through the connector when the connector is fitted with the connector part.

According to the present disclosure, it is possible to provide a work device capable of improving workability of data transmission work for transmitting data to a feeder carriage.

DESCRIPTION OF EMBODIMENTS

Figure 1:
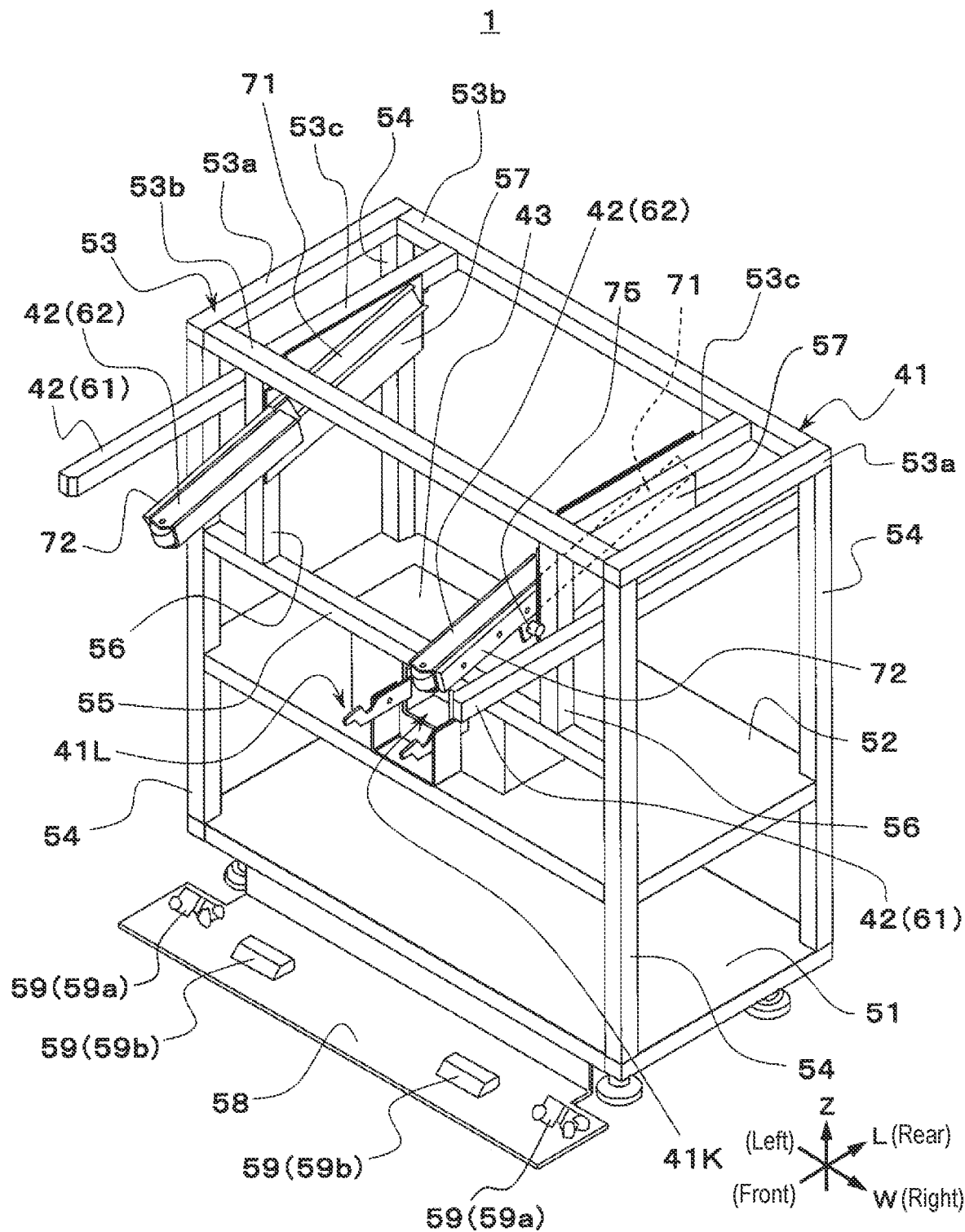
FIG. 1 is a perspective view of a work device according to an embodiment of the present disclosure.
Figure 2A:
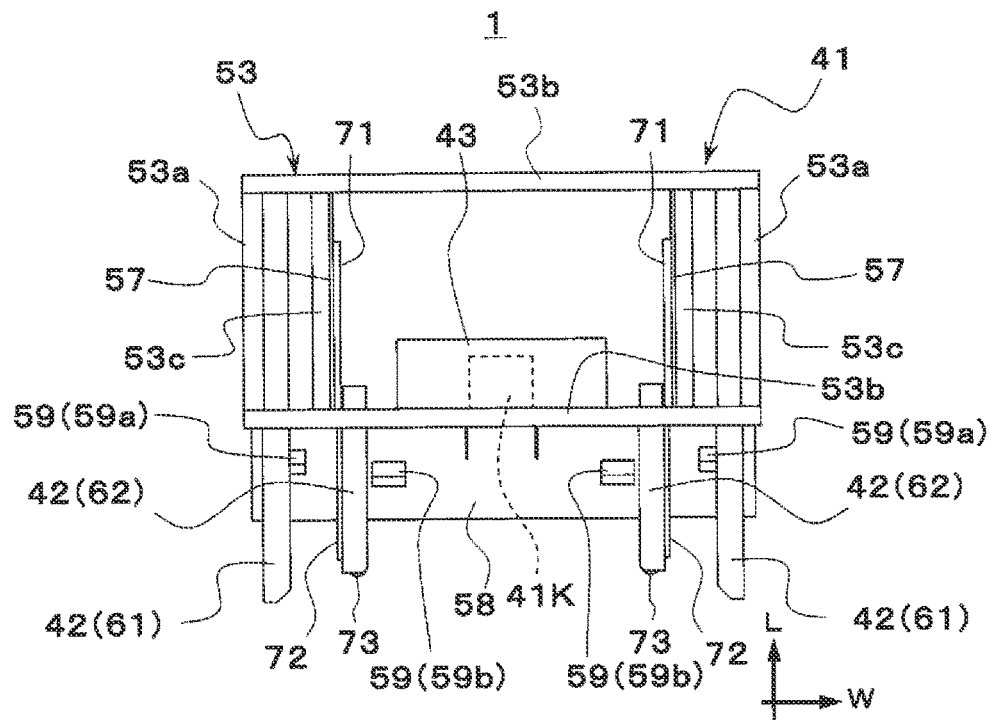
FIG. 2A is a plan view of the work device shown in FIG. 1.
Figure 2B:
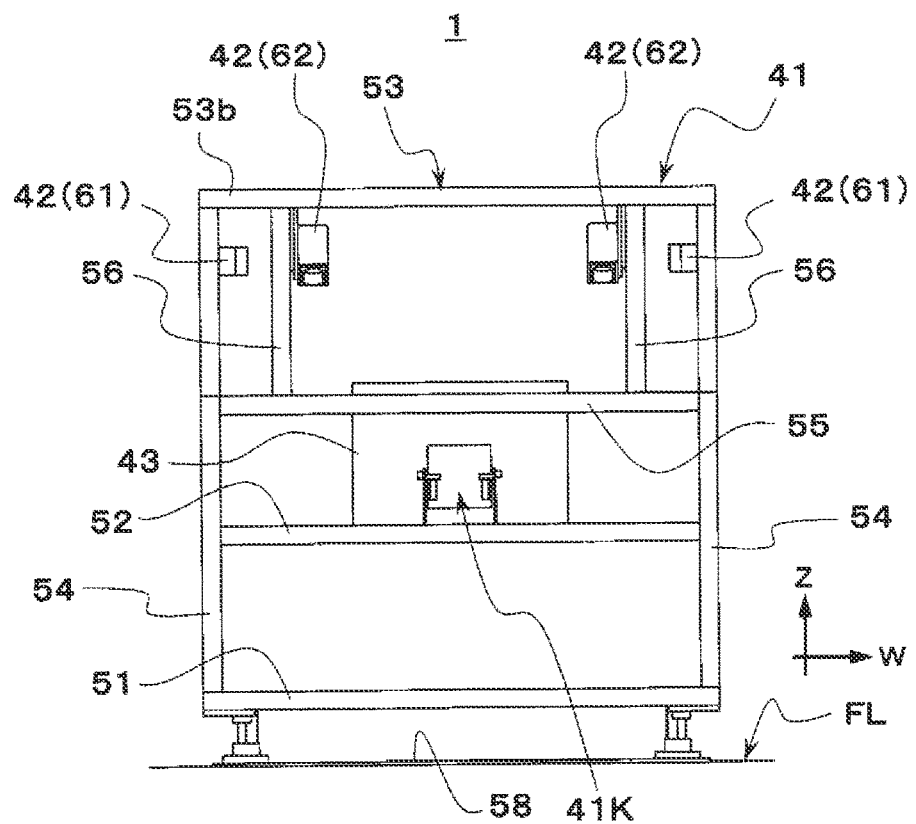
FIG. 2B is a front view of the work device shown in FIG. 1.

Hereinafter, embodiments of the present disclosure will be described with reference to the drawings. FIGS. 1 to 2B show work device 1 according to an embodiment of the present disclosure. Work device 1 is a device that transmits data to feeder carriage 10 of component mounter 2 shown in FIG. 3 as a work object. First, a configuration of component mounter 2 will be described.

Figure 3:
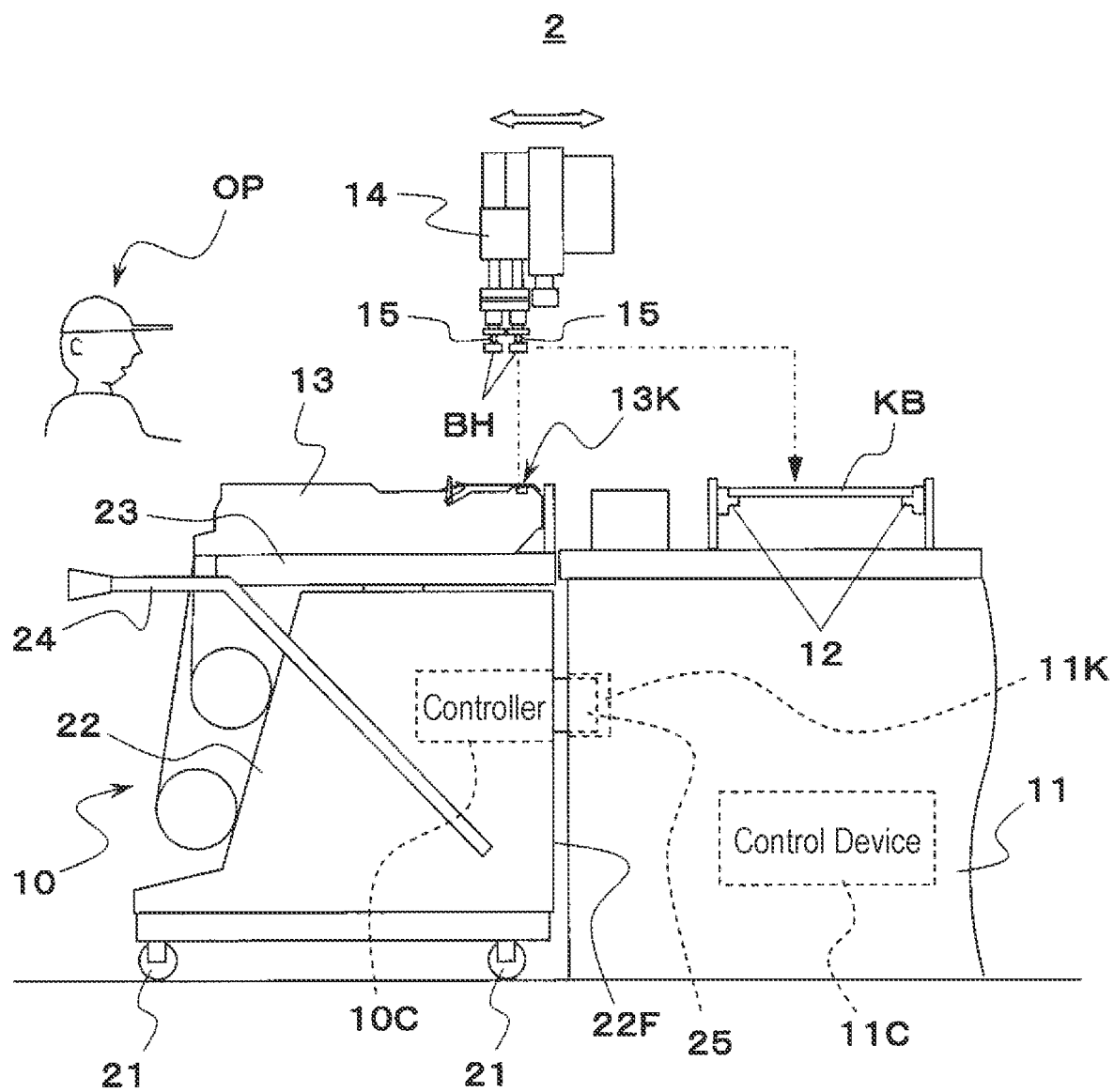
FIG. 3 is a side view of a main part of a component mounter including a feeder carriage to which data is transmitted by the work device shown in FIG. 1.

In FIG. 3, component mounter 2 includes base 11, board transport device 12 provided on base 11, feeder carriage 10 connected to base 11, parts feeder 13 installed on feeder carriage 10, and installing head 14. Board transport device 12 is configured of a pair of conveyor mechanisms, and transfers board KB supplied from an upstream process to be positioned at a predetermined position. Parts feeder 13 supplies component BH to component supply port 13K in a state in which feeder carriage 10 is connected to base 11. Installing head 14 has nozzle 15 for sucking component BH, and reciprocates between parts feeder 13 and board KB to install component BH supplied by parts feeder 13 on board KB. When all components BH to be installed on board KB are installed by installing head 14, board transport device 12 transfers board KB to a downstream process.

Figure 4A:
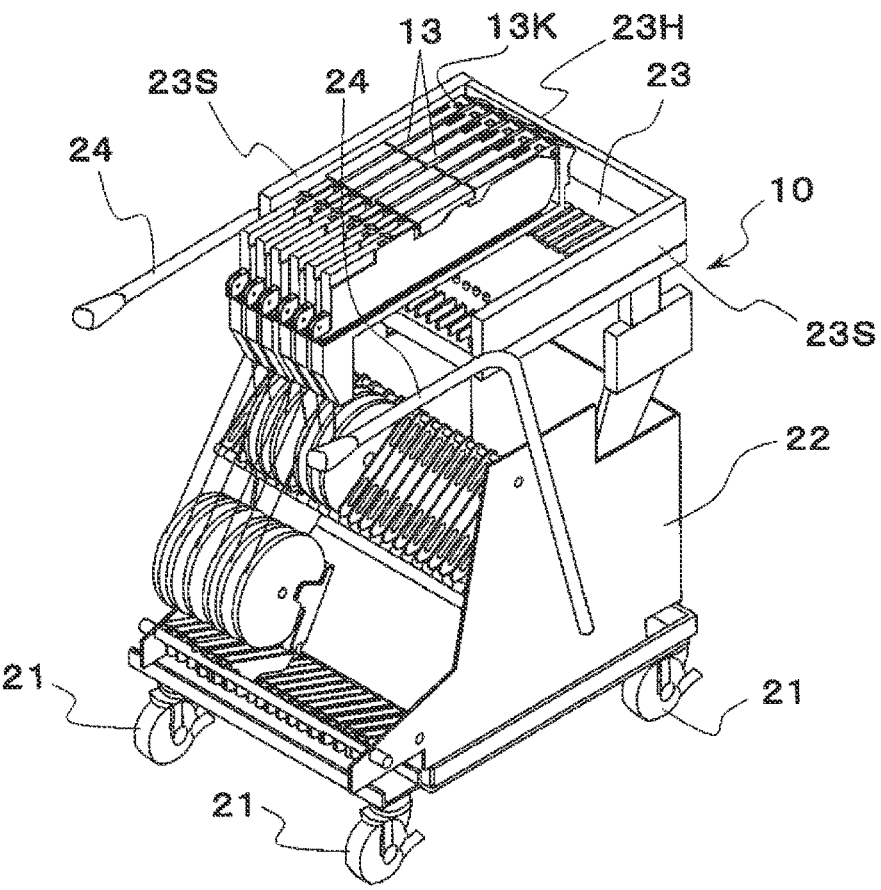
FIG. 4A is a perspective view showing the feeder carriage to which data is transmitted by the work device shown in FIG. 1 together with a parts feeder.
Figure 4B:
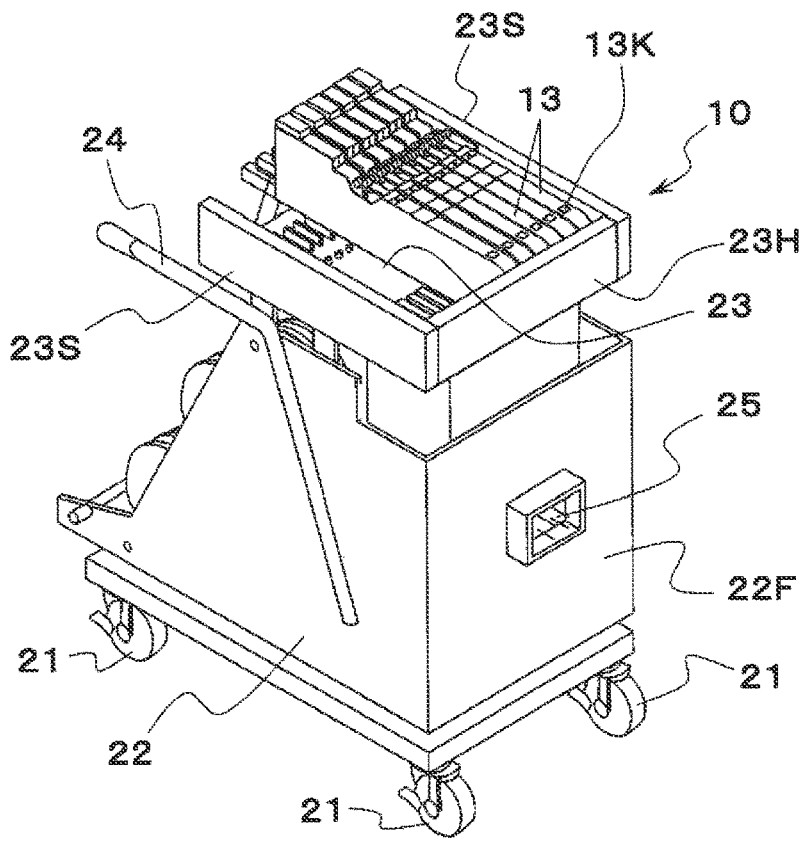
FIG. 4B is another perspective view showing the feeder carriage and the parts feeder shown in FIG. 4A.

In component mounter 2 having such a configuration, feeder carriage 10 is used as a support base for parts feeder 13. As shown in FIGS. 4A and 4B, feeder carriage 10 has base part 22 provided with four wheels 21 on front, rear, left, and right sides. Feeder base 23 is provided above base part 22.

In FIGS. 4A and 4B, feeder base 23 has left and right side plates 23S on right and left sides, and has back plate 23H on a back side (a side close to base 11 in a case where feeder carriage 10 is connected to base 11). A plurality of parts feeders 13 can be installed on feeder base 23. Left and right handles 24 operated by worker OP shown in FIG. 3 are provided on the left and right sides of base part 22, worker OP can make feeder carriage 10 travel on floor surface FL shown in FIG. 2B by operating left and right handles 24.

As shown in FIG. 3, base 11 is provided with connector 11K. In FIGS. 3 and 4B, connector 25 fitted to connector 11K is provided on base-facing surface 22F on the back side of base part 22. When feeder carriage 10 is connected to base 11, worker OP operates left and right handles 24 to make feeder carriage 10 travel on floor surface FL in a state in which base-facing surface 22F faces base 11. Then, feeder carriage 10 is brought close to base 11 after making connector 25 face connector 11K. When feeder carriage 10 is located within a certain range with respect to base 11, the approach of feeder carriage 10 is detected by a sensor (not shown), and feeder carriage 10 is connected to base 11 by a connection mechanism (not shown). When feeder carriage 10 is connected to base 11 in this manner, connector 25 is fitted to connector 11K (FIG. 3).

When feeder carriage 10 is connected to base 11 and connector 25 is fitted to connector 11K, controller 10C provided in feeder carriage 10 and control device 11C of base 11 are electrically connected to each other, and data can be transmitted between controller 10C and control device 11C. In addition, by separating feeder carriage 10 connected to base 11 from base 11 and pulling out connector 25 from connector 11K, the electrical connection between controller 10C of feeder carriage 10 and control device 11C of base 11 can be released.

Figure 5A:
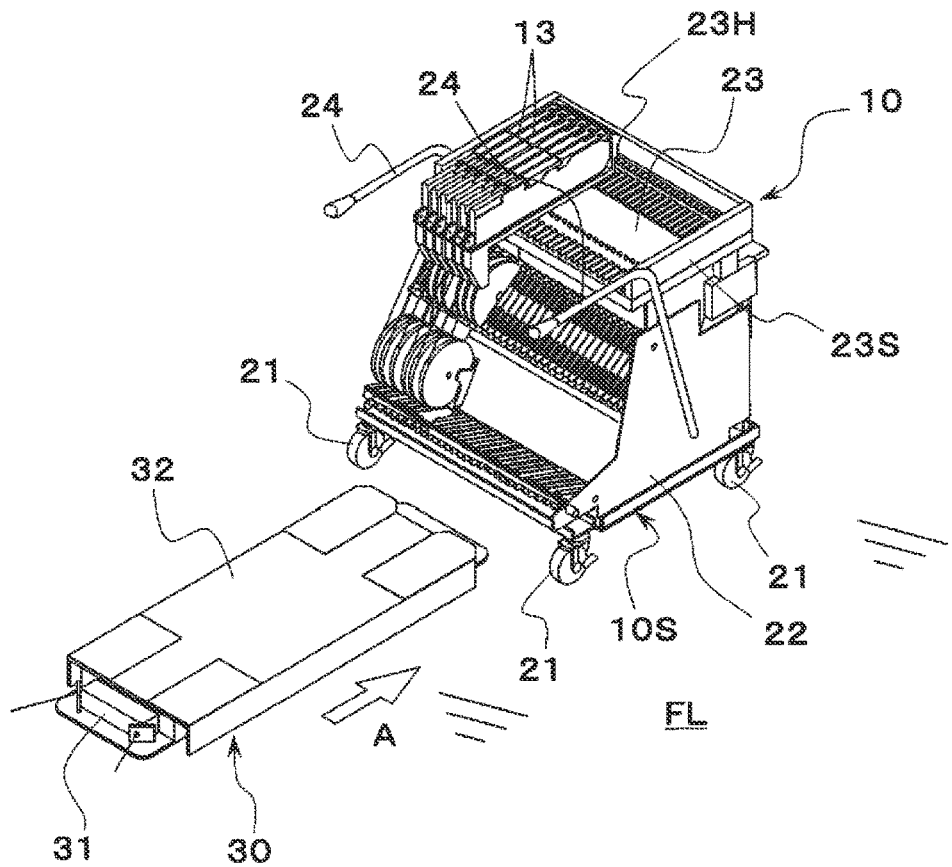
FIG. 5A is a perspective view showing the feeder carriage shown in FIG. 4A together with an automated guided vehicle.
Figure 5B:
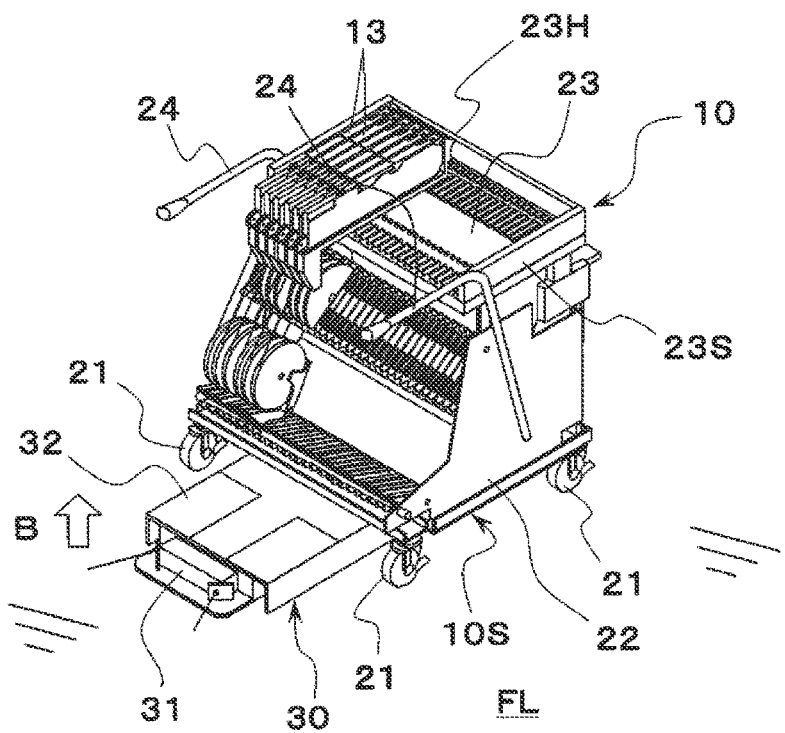
FIG. 5B is a perspective view showing a state in which the automated guided vehicle is located under the feeder carriage shown in FIG. 5A.

Feeder carriage 10 can be connected to and separated from base 11 by worker OP operating left and right handles 24 as described above, or by using automated guided vehicle 30 shown in FIGS. 5A and 5B. In a case where automated guided vehicle 30 is used, unmanned work is performed without human intervention.

Figure 6A:
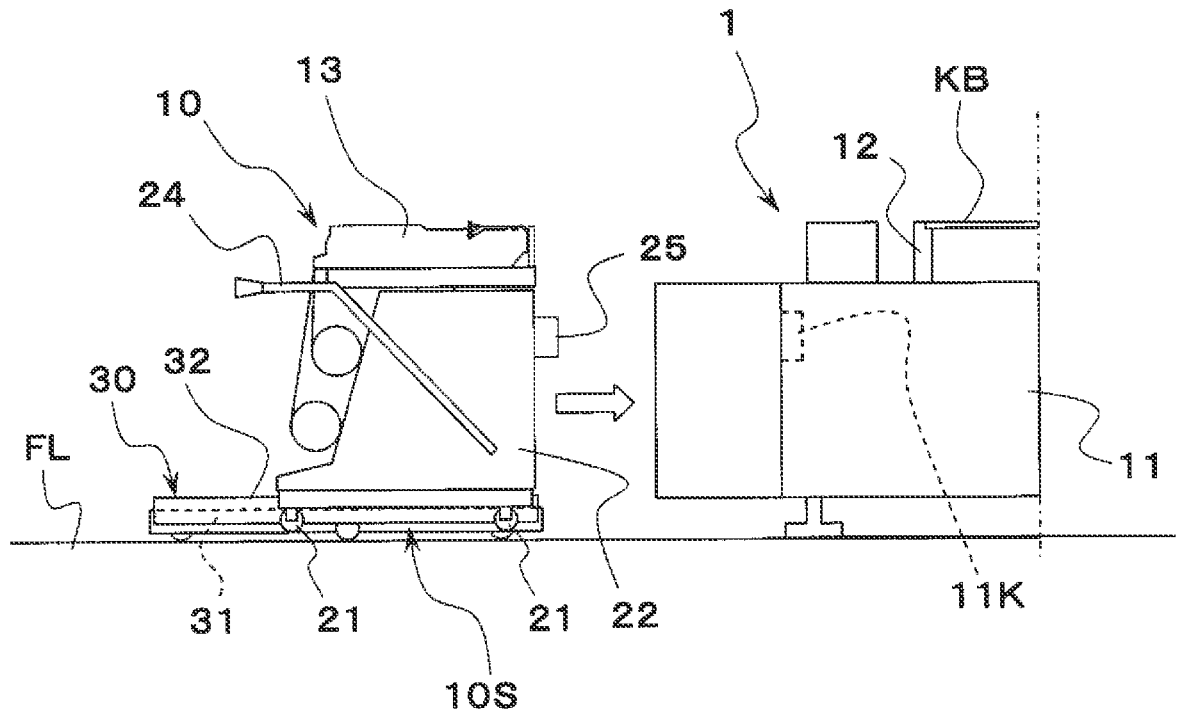
FIG. 6A is a side view showing a situation in which the feeder carriage shown in FIG. 5A is brought closer to a base of the component mounter by the automated guided vehicle.
Figure 6B:
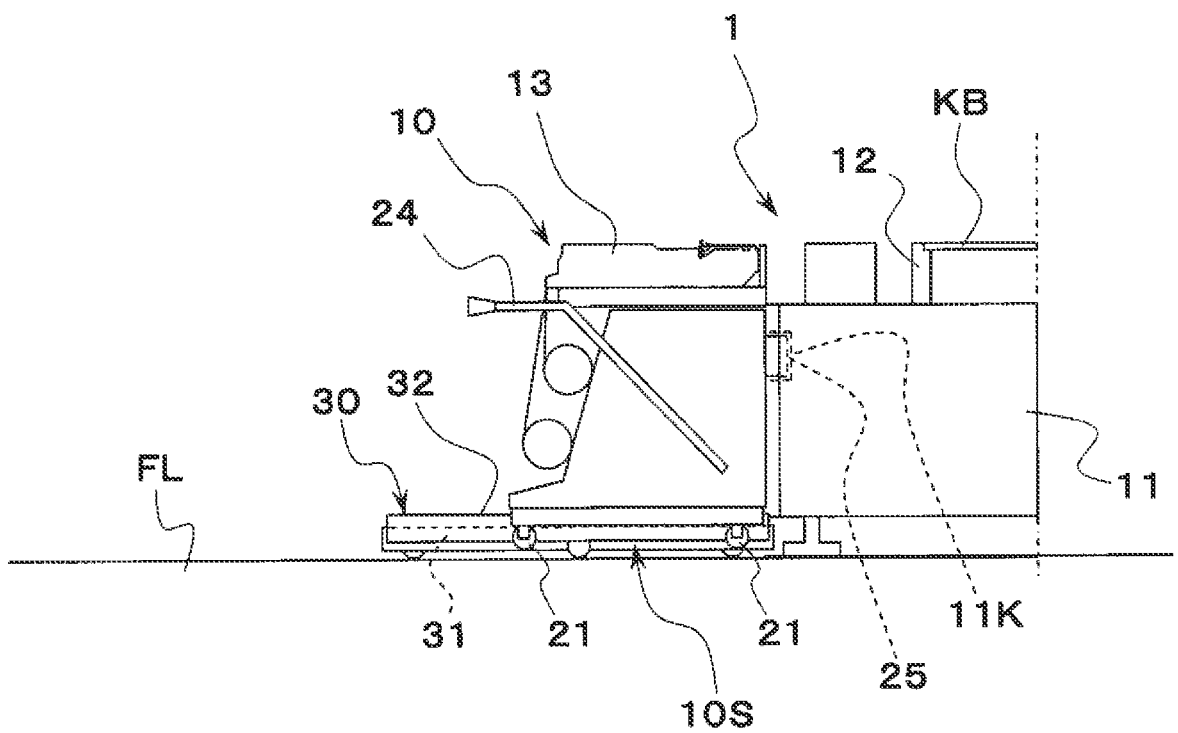
FIG. 6B is a side view showing a situation in which the feeder carriage is connected to the base of the component mounter, proceeding from the situation shown in FIG. 6A.

As shown in FIGS. 5A and 5B, automated guided vehicle 30 has traveling body 31 that travels on floor surface FL and top plate 32 that can be raised up and lowered with respect to traveling body 31, and is wirelessly controlled by a traveling controller (not shown) to autonomously travel on floor surface FL and raise and lower top plate 32. When automated guided vehicle 30 lifts and supports feeder carriage 10, automated guided vehicle 30 travels on floor surface FL to enter space below bottom 10S of feeder carriage 10 (arrow A shown in FIG. 5A), raises top plate 32 (arrow B shown in FIG. 5B), and lifts and supports feeder carriage 10 (FIG. 5B). Automated guided vehicle 30 that lifts and supports feeder carriage 10 autonomously travels on floor surface FL, and connects feeder carriage 10 to base 11 by bringing feeder carriage 10 close to base 11 after making connector 25 face connector 11K (FIG. 6A to FIG. 6B).

Figure 7A:
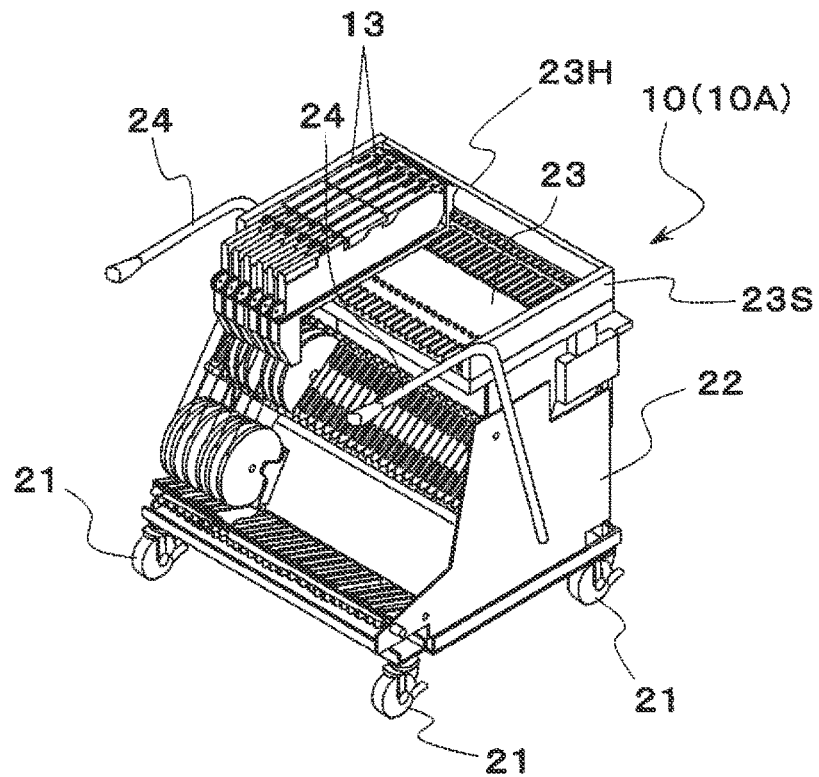
FIG. 7A is a perspective view of a wider carriage to which data is transmitted by the work device shown in FIG. 1.
Figure 7B:
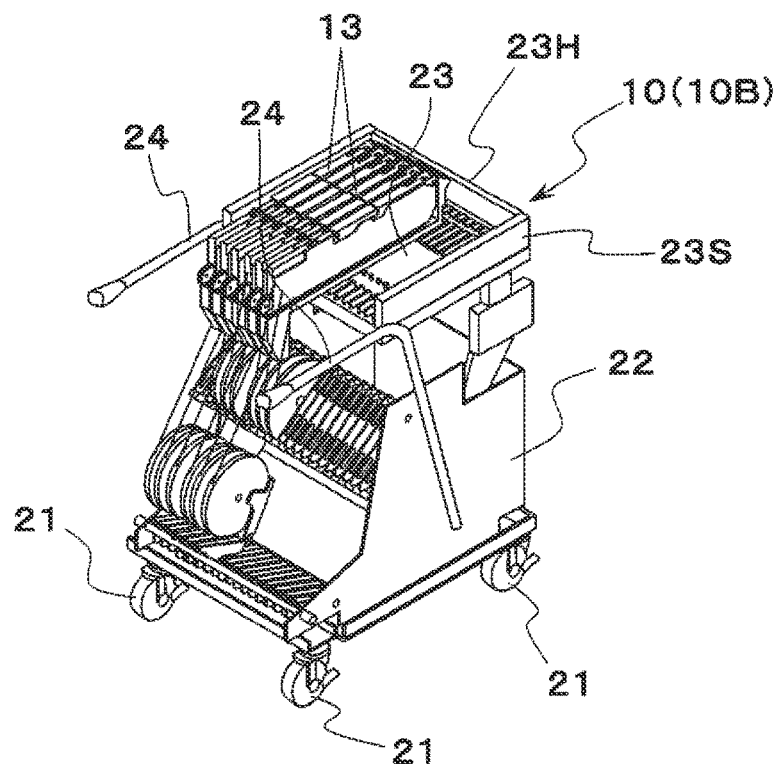
FIG. 7B is a perspective view of a narrower carriage to which data is transmitted by the work device shown in FIG. 1.

As feeder carriage 10 connected to component mounter 2, one of two types of feeder carriages 10 having different horizontal dimensions is used according to a type of component mounter 2. In the present embodiment, of the two types of feeder carriages 10, feeder carriage 10 having a larger horizontal dimension is referred to as wider carriage 10A shown in FIG. 7A, and feeder carriage 10 having a smaller horizontal dimension is referred to as narrower carriage 10B shown in FIG. 7B.

Next, work device 1 will be described. As described above, work device 1 is a device that transmits data to feeder carriage 10 as a work object. Specifically, the work of transmitting data to feeder carriage 10 through connector 25 of feeder carriage 10 is performed. Here, L-axis, W-axis, and Z-axis as shown in FIG. 1 are defined as coordinate axes for convenience of describing a configuration of work device 1. The L-axis is an axis extending in a front-rear direction of work device 1, and the W-axis is an axis extending in a horizontal direction of work device 1. The Z-axis is an axis extending in a vertical direction of work device 1.

FIGS. 1 to 2B, work device 1 has main body 41, left and right guides 42, and data transmitter 43. Main body 41 is formed in a box shape as a whole, and has connector part 41K fitted to connector 25 of feeder carriage 10 on a front surface. Left and right guides 42 are provided so as to project from the front surface of main body 41 in a substantially horizontal direction. Guide 42 guides feeder carriage 10 so that connector 25 is fitted to connector part 41K when feeder carriage 10 is brought close to main body 41 while making connector 25 face connector part 41K (details will be described later). Therefore, connector 25 can be reliably fitted to connector part 41K. Connector part 41K may be disposed in an optimum direction (longitudinal direction, diagonal direction, or the like) according to a shape of connector 25. In addition, connector part 41K may be provided so as to be housed inside main body 41 without projecting from main body 41.

Data transmitter 43 is provided in main body 41 and transmits various items of data (for example, work data of parts feeder 13) to feeder carriage 10 through connector 25 fitted to connector part 41K. Connector part 41K is configured to be able to be fitted to both connector 25 of wider carriage 10A and connector 25 of narrower carriage 10B.

As shown in FIG. 1, connector lock 41L is provided in the vicinity of connector part 41K on the front surface of main body 41. Connector lock 41L operates so that connector 25 is locked to main body 41 when connector 25 is fitted to connector part 41K.

In FIGS. 1 to 2B, main body 41 has bottom floor 51, intermediate floor 52, upper frame 53, four pillars 54, horizontal crosspiece 55, two vertical crosspieces 56, two guide attachment plates 57, wheel stop base 58, and a plurality of wheel stops 59. Bottom floor 51, intermediate floor 52, and upper frame 53 each have a rectangular shape, and are disposed in this order from the lower side. Four corners of bottom floor 51, intermediate floor 52, and upper frame 53 are supported by four pillars 54 extending vertically.

In FIGS. 1 to 2B, upper frame 53 has two left and right front-rear bars 53a extending along the L-axis, two front and rear horizontal bars 53b extending along the W-axis, and two intermediate front-rear bars 53c provided between two front-rear bars 53a along the L-axis. Data transmitter 43 is attached to intermediate floor 52. Connector part 41K is electrically connected to data transmitter 43, and opens forward from a region between intermediate floor 52 and upper frame 53.

Figure 8:
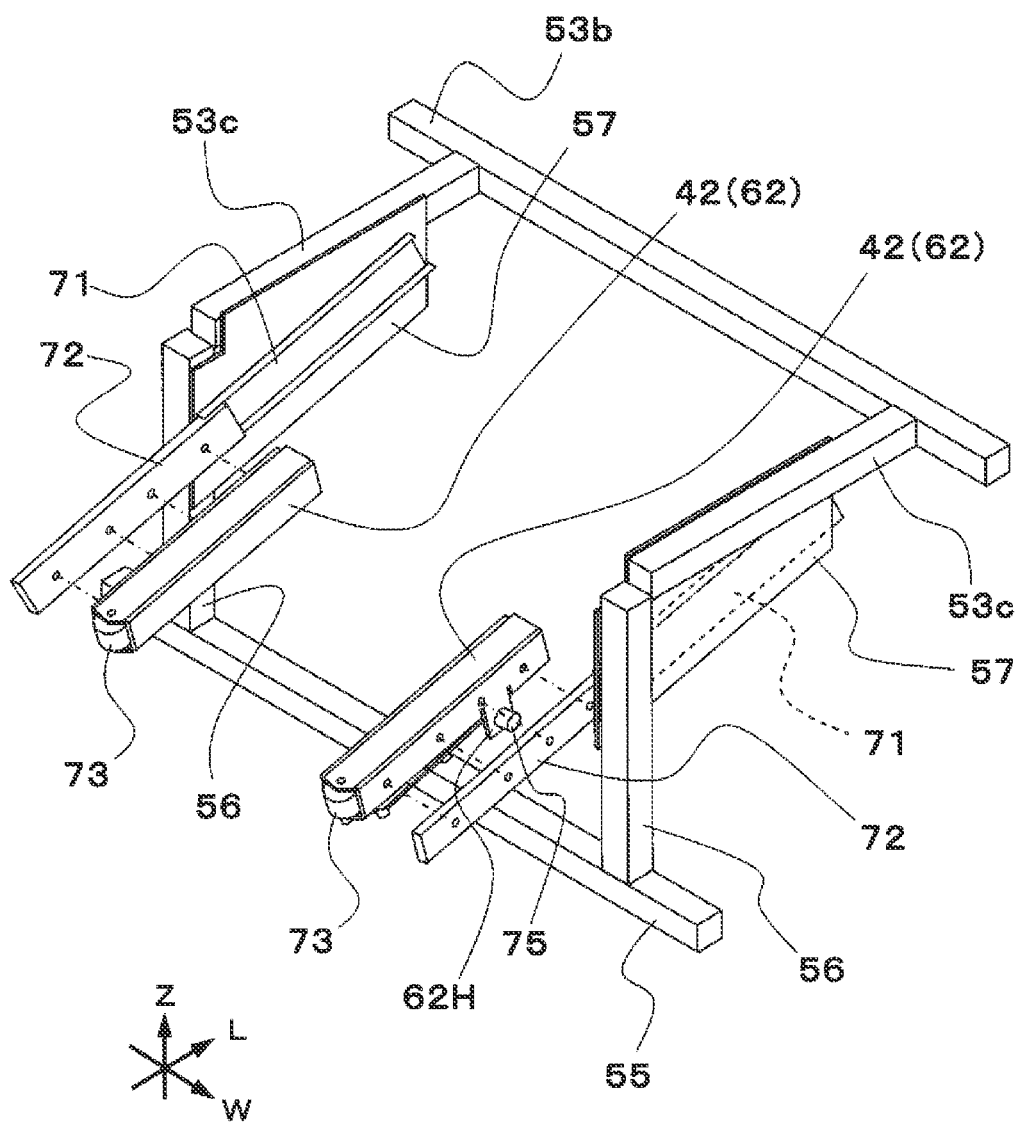
FIG. 8 is a partially exploded perspective view showing a configuration of an inner guide included in the work device shown in FIG. 1.

In FIGS. 1 to 2B, horizontal crosspiece 55 is located between intermediate floor 52 and front horizontal bar 53b, extends along the W-axis, and both ends thereof are supported by two front pillars 54. Two vertical crosspieces 56 extend along the Z-axis, and upper and lower ends thereof are respectively supported by horizontal crosspiece 55 and front horizontal bar 53b. As shown in FIG. 8, two guide attachment plates 57 have upper edges supported by intermediate front-rear bars 53c and front edges supported by vertical crosspieces 56.

In FIGS. 1 to 2B, wheel stop base 58 extends from bottom floor 51 to the front side and is located on floor surface FL. Each of the plurality of wheel stops 59 is provided on an upper surface of wheel stop base 58. The plurality of wheel stops 59 have left and right outer wheel stops 59a compatible with wider carriage 10A and left and right inner wheel stops 59b compatible with narrower carriage 10B. Since a distance between left and right wheels 21 of wider carriage 10A is larger than a distance between left and right wheels 21 of narrower carriage 10B, a (horizontal) distance between left and right outer wheel stops 59a along the W-axis is larger than a distance between left and right inner wheel stops 59b along the W-axis.

In FIGS. 1 to 2B, left and right guides 42 are compatible with two types of feeder carriages 10 (wider carriage 10A and narrower carriage 10B) having different horizontal dimensions, and have two types (outer guide 61 and inner guide 62) having different horizontal distances. Of these two types of left and right guides 42, a pair of left and right outer guides 61 disposed on the left and right sides is compatible with wider carriage 10A having a larger horizontal dimension, and a pair of left and right inner guides 62 disposed on the left and right sides is compatible with narrower carriage 10B having a smaller horizontal dimension. In this way, work device 1 is compatible with wider carriage 10A and narrower carriage 10B having a horizontal dimension smaller than that of wider carriage 10A as feeder carriage 10.

Left and right outer guides 61 have a distance slightly larger than a distance between left and right side plates 23S of wider carriage 10A, and guide left and right side surfaces (outer surfaces of left and right side plates 23S) of wider carriage 10A so that connector 25 of wider carriage 10A is fitted to connector part 41K of work device 1 when wider carriage 10A is brought close to main body 41. In addition, left and right inner guides 62 have a distance slightly larger than a distance between left and right side plates 23S of narrower carriage 10B, and guide left and right side surfaces of narrower carriage 10B so that connector 25 of narrower carriage 10B is fitted to connector part 41K of work device 1 when narrower carriage 10B is brought close to main body 41.

In FIGS. 1 to 2B, left and right outer guides 61 and left and right inner guides 62 are respectively disposed such that intermediate positions of lengths (horizontal length) along the W-axis coincide with the center of a length of main body 41 along the W-axis. Each of left and right outer guides 61 has a rear portion fixed to two front and rear pillars 54 of main body 41 and extends in a substantially horizontal direction, and has a front end (tip end) projecting and extending to the front side of main body 41. The tip end of each of left and right outer guides 61 is located at a height of each of left and right side plates 23S of feeder carriage 10.

Figure 9A:
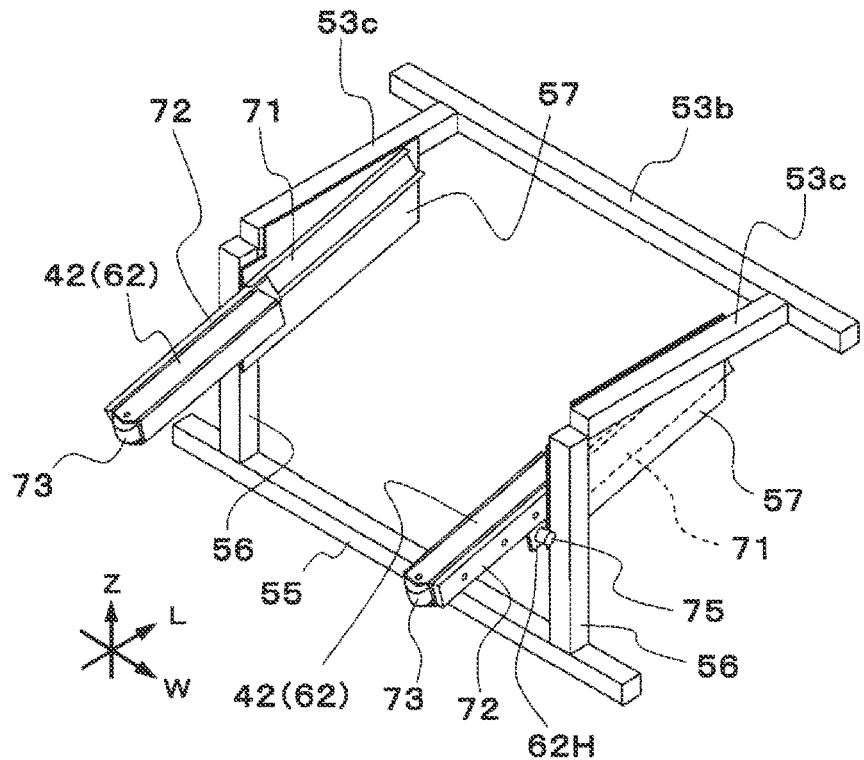
FIG. 9A is a perspective view showing a state in which the inner guide shown in FIG. 8 is in a projection position.
Figure 9B:
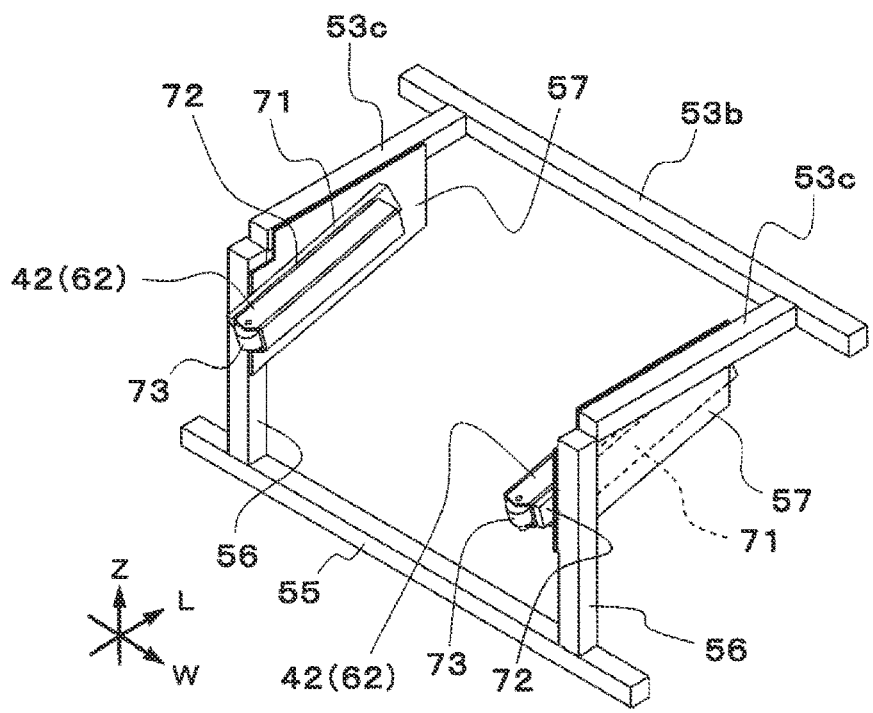
FIG. 9B is a perspective view showing a state in which the inner guide shown in FIG. 8 is in a storage position.

In FIGS. 8 to 9B, inner guide 62 is attached to each of two guide attachment plates 57 of main body 41 via linearly extending guide rail 71 and slider 72 moving freely on guide rail 71. Guide rail 71 is attached to an inner surface side of guide attachment plate 57 (a side directed to the center of main body 41), and slider 72 moves (slides) freely on an inner surface side of guide rail 71. Guide rail 71 and slider 72 are configured as a unit (slide pack).

Inner guide 62 is attached to slider 72. Therefore, inner guide 62 can move (slide) along guide rail 71 integrally with slider 72, and can move between a position at which inner guide 62 project forward from main body 41 (projection position. FIG. 9A) and a position at which inner guide 62 are stored in main body 41 (storage position. FIG. 9B).

As shown in FIGS. 8 to 9B and FIG. 10, each of left and right guide rails 71 is provided in an inclined manner so that the tip end (front end) thereof is directed downward. Each of left and right inner guides 62 is located at the projection position by self-weight in a state in which the tip end thereof is not pressed toward main body 41. The tip end of each of left and right inner guides 62 located at the projection position is located at a height of each of left and right side plates 23S of feeder carriage 10.

Figure 10:
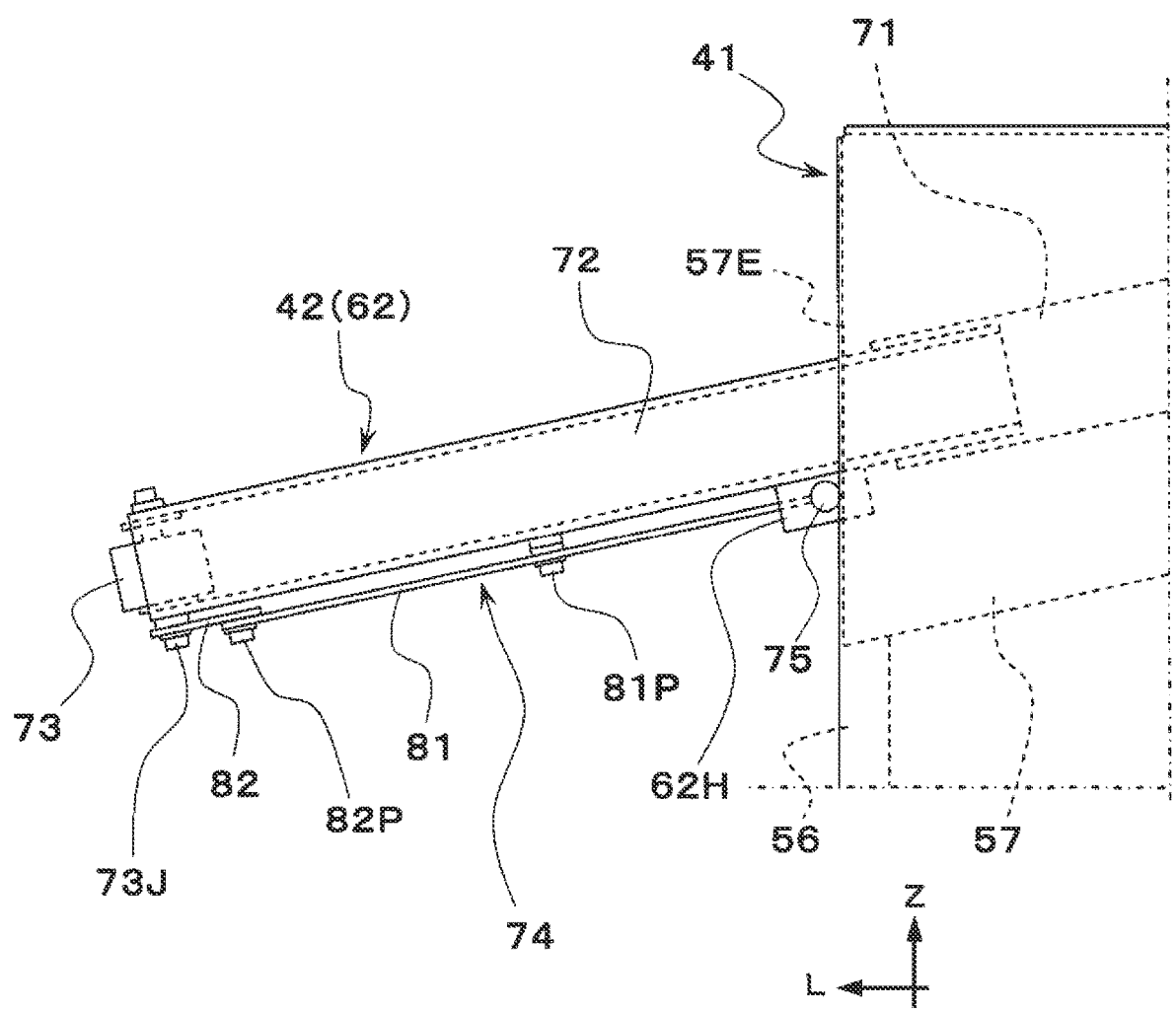
FIG. 10 is a side view showing the state in which the inner guide shown in FIG. 8 is in a projection position.
Figure 11A:
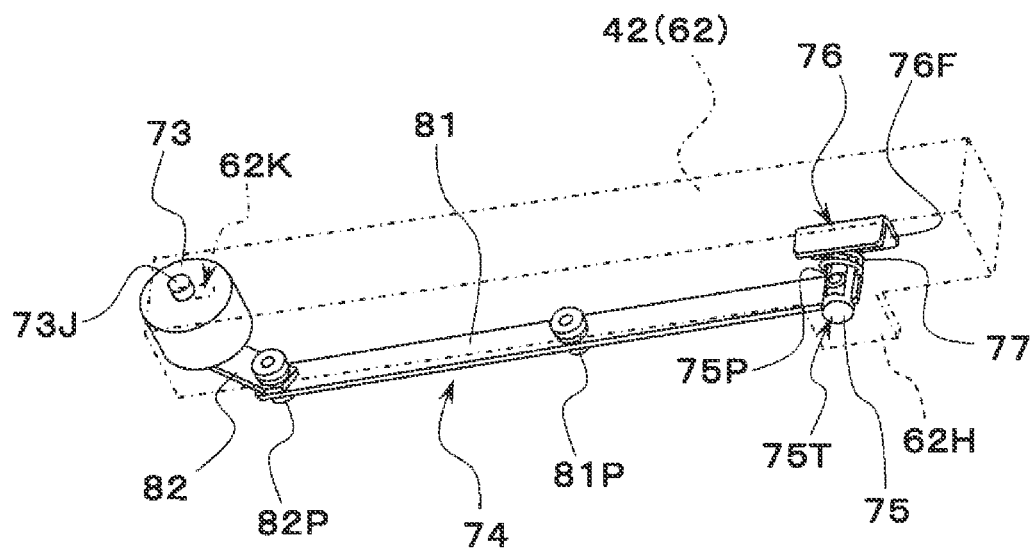
FIG. 11A is a perspective view of a link mechanism included in the inner guide shown in FIG. 8.
Figure 11B:
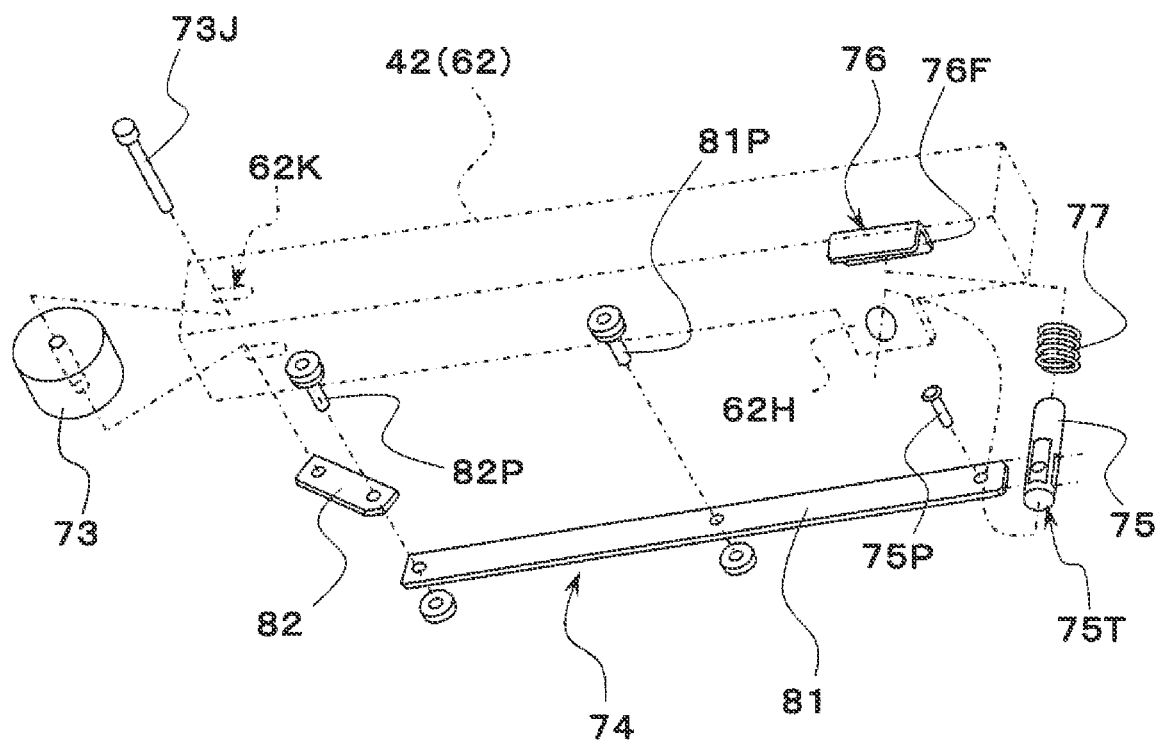
FIG. 11B is an exploded perspective view of the link mechanism shown in FIG. 11A.

In FIGS. 10 to 11B, roller 73 as an abutting member is attached to the tip end of each of left and right inner guides 62. Roller support shaft 73J is provided at the tip end of inner guide 62 so as to extend substantially vertically, and roller support shaft 73J is inserted into roller 73. Therefore, roller 73 is rotatable around roller support shaft 73J at the tip end of inner guide 62.

Figure 12A:
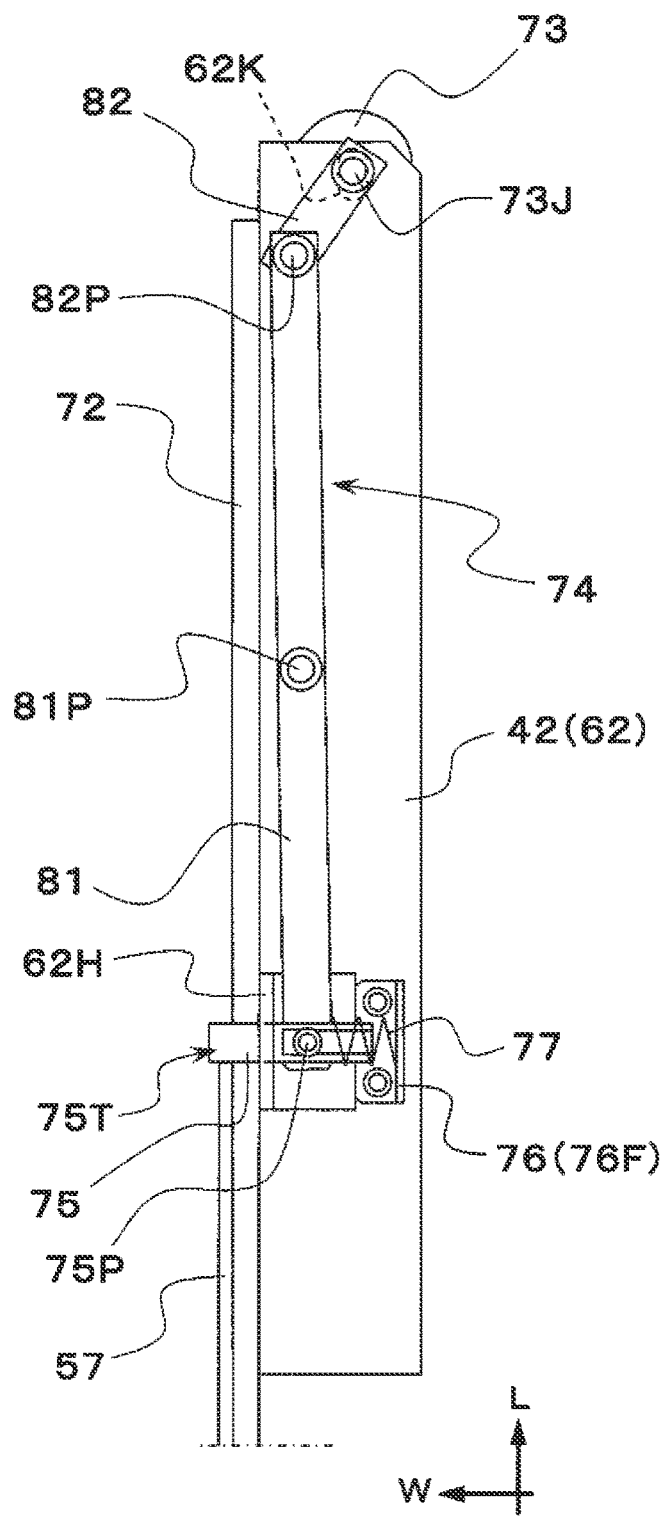
FIG. 12A is a bottom view of the inner guide shown on the left side of FIG. 8.
Figure 12B:
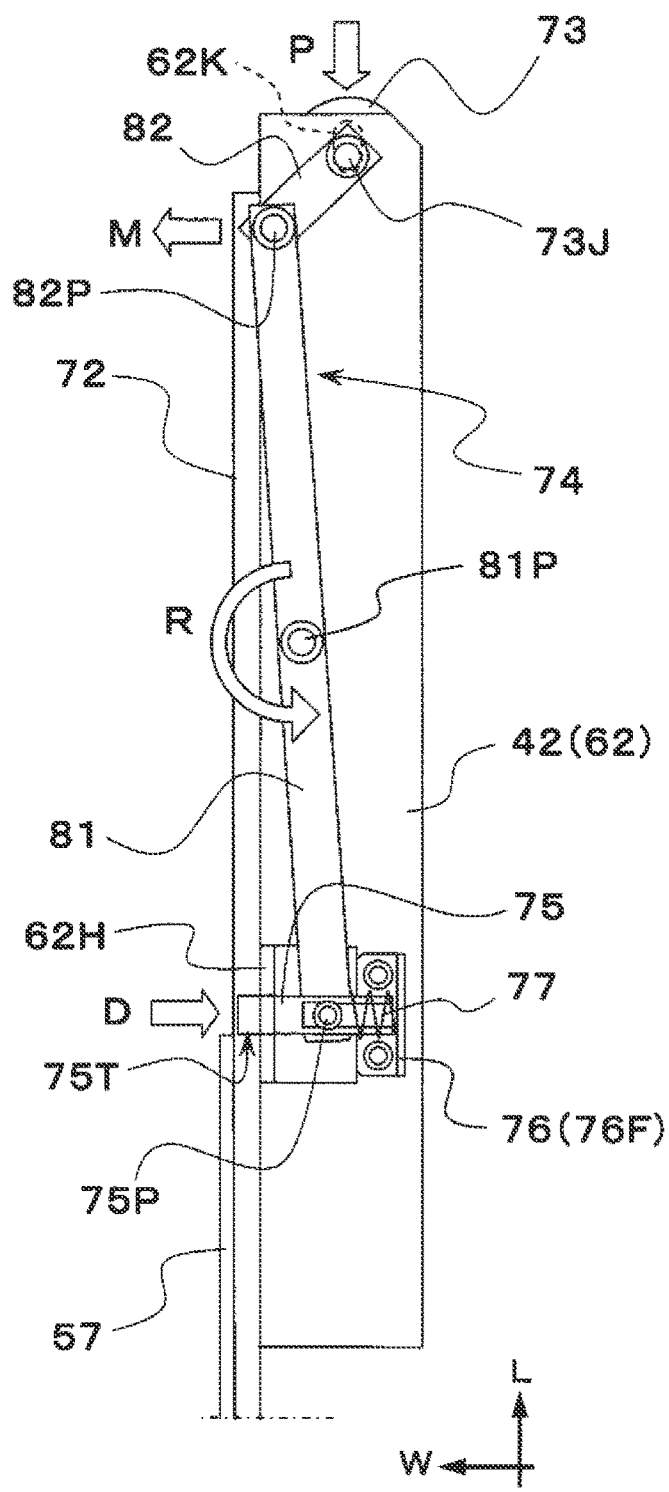
FIG. 12B is a bottom view showing a state in which a roller is pushed in the inner guide shown in FIG. 12A.

In FIGS. 12A and 12B, inner guide 62 extends along the L-axis. Elongated hole 62K extending along the L-axis is provided at the tip end of inner guide 62 (the end on the upper side of the paper in FIGS. 12A and 12B) (see also FIGS. 11A and 11B), and roller support shaft 73J is inserted into elongated hole 62K. Therefore, roller 73 can move a little with respect to the tip end of inner guide 62 together with roller support shaft 73J within a range where roller support shaft 73J can move within elongated hole 62K.

In FIGS. 10 to 12B, link mechanism 74 and lock pin 75 are provided on a lower surface side of each of left and right inner guides 62. Link mechanism 74 is connected to roller support shaft 73J, and lock pin 75 extends along the W-axis and moves in an axial direction thereof by link mechanism 74. That is, lock pin 75 moves along the W-axis.

In FIGS. 10 to 12B, link mechanism 74 has main arm 81 and sub arm 82. The center of main arm 81 is supported by swing support shaft 81P. Swing support shaft 81P is provided at the center in a lengthwise direction on the lower surface side of inner guide 62. That is, swing support shaft 81P is provided at the center of inner guide 62 along the L-axis. Main arm 81 is swingable around swing support shaft 81P in a plane parallel to the lower surface of inner guide 62.

In FIGS. 10 to 12B, one end side of sub arm 82 is pivotably connected to roller support shaft 73J, and the other end side thereof is pivotably connected to a front end of main arm 81 by pivot shaft 82P. As shown in FIGS. 12A and 12B, main arm 81 extends substantially along the L-axis, and sub arm 82 extends obliquely with respect to the L-axis (that is, with respect to main arm 81).

In FIGS. 12A and 12B, lock pin 75 is pivotably connected to a rear end of main arm 81 by lock pin attachment shaft member 75P. Lock pin guide 62H (see also FIG. 8 and FIGS. 10 to 11B) extending downward from a side surface of inner guide 62 is formed on inner guide 62.

In FIGS. 12A and 12B, lock pin 75 penetrates lock pin guide 62H toward the outside (the direction away from the center of main body 41) along the W-axis. Hereinafter, of left and right ends of lock pin 75, an end that penetrates lock pin guide 62H is referred to as outer end 75T.

In FIGS. 11A to 12B, spring pressing member 76 is provided on the lower surface of inner guide 62. Spring pressing member 76 has flange 76F extending downward, and flange 76F is located facing lock pin guide 62H along the W-axis (FIGS. 12A and 12B).

In FIGS. 11A to 12B, return spring 77 is inserted into a position near flange 76F of lock pin 75. Return spring 77 is contracted between main arm 81 and flange 76F, and lock pin 75 is in a state of being biased by return spring 77 to the outside on left and right as viewed from main body 41 (toward the left side of the paper in FIGS. 12A and 12B).

In a state in which inner guide 62 is located at the projection position and no rearward pressing force is applied to roller 73 (this state of inner guide 62 is referred to as an "initial state"), outer end 75T of lock pin 75 is located at a position protruding outward from a side surface of slider 72 (overhanging position) (FIG. 12A). Outer end 75T of lock pin 75 located at the overhanging position abuts on front edge 57E of guide attachment plate 57 of main body 41 from the front (FIGS. 10 and 13), and inner guide 62 is locked to main body 41.

As described above, sub arm 82 extends obliquely with respect to main arm 81. Therefore, when roller 73 of inner guide 62 in the initial state is pressed to the rear side (arrow P shown in FIG. 12B), roller support shaft 73J moves rearward in elongated hole 62K, and pivot shaft 82P moves along the W-axis by sub arm 82 (arrow M shown in FIG. 12B). Accordingly, main arm 81 swings around swing support shaft 81P (arrow R shown in FIG. 12B), so that lock pin 75 moves in a direction opposite to a direction in which pivot shaft 82P moves while pressing and contracting return spring 77 (arrow D shown in FIG. 12B), and outer end 75T of lock pin 75 is located at a "non-overhanging position" not protruding outward from the side surface of slider 72 (FIG. 12A to FIG. 12B).

Figure 14:
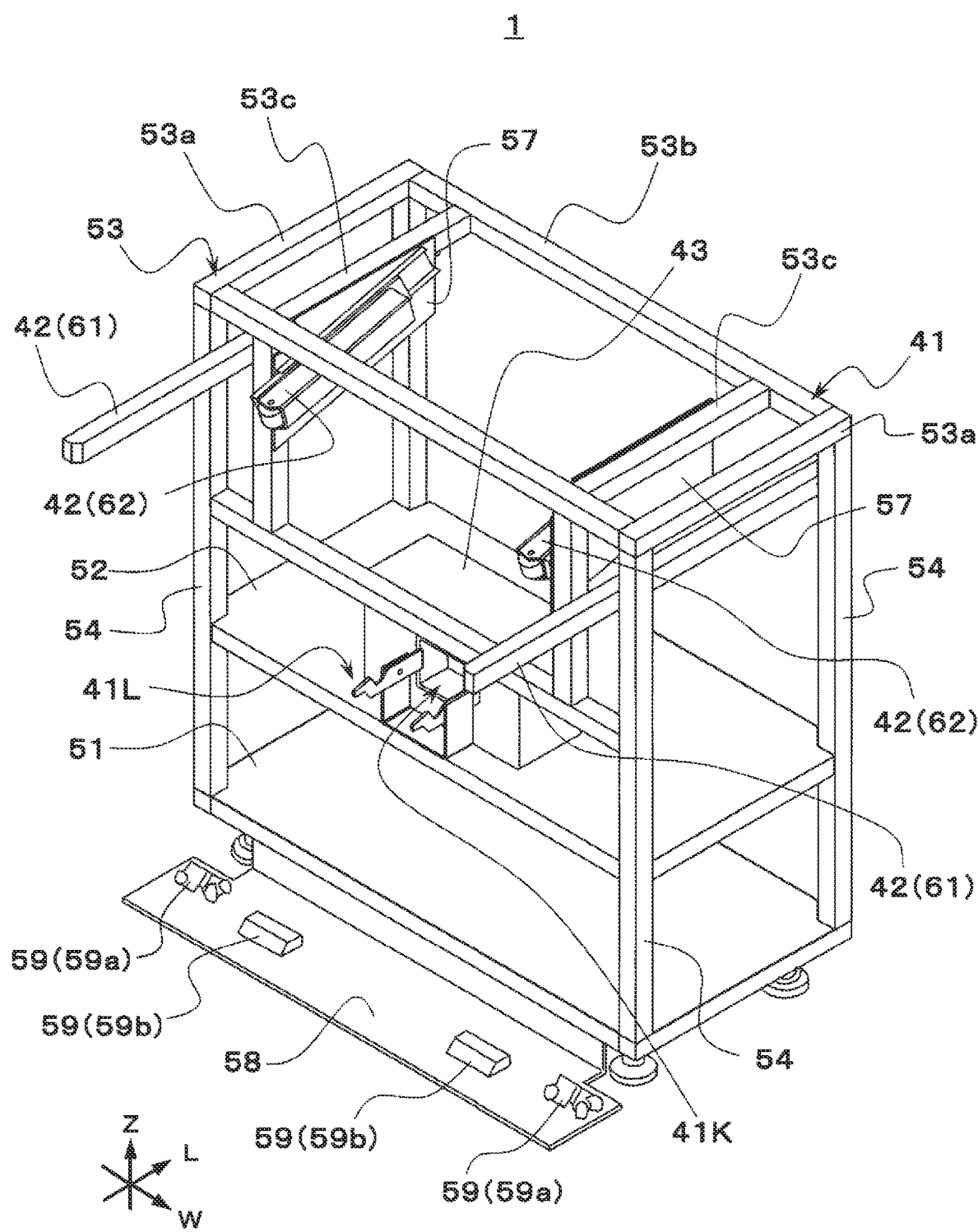
FIG. 14 is a perspective view showing the state in which the inner guide is in a storage position, as shown in FIG. 9B.

When outer end 75T of lock pin 75 is located at the non-overhanging position by pressing roller 73 of inner guide 62 in the initial state to the rear side, the lock of inner guide 62 with respect to main body 41 is released. Therefore, inner guide 62 slides rearward on guide rail 71 in accordance with the pressing thereof (FIG. 9A to FIG. 9B, and is located at the storage position (FIGS. 9B and 14).

Figure 13:
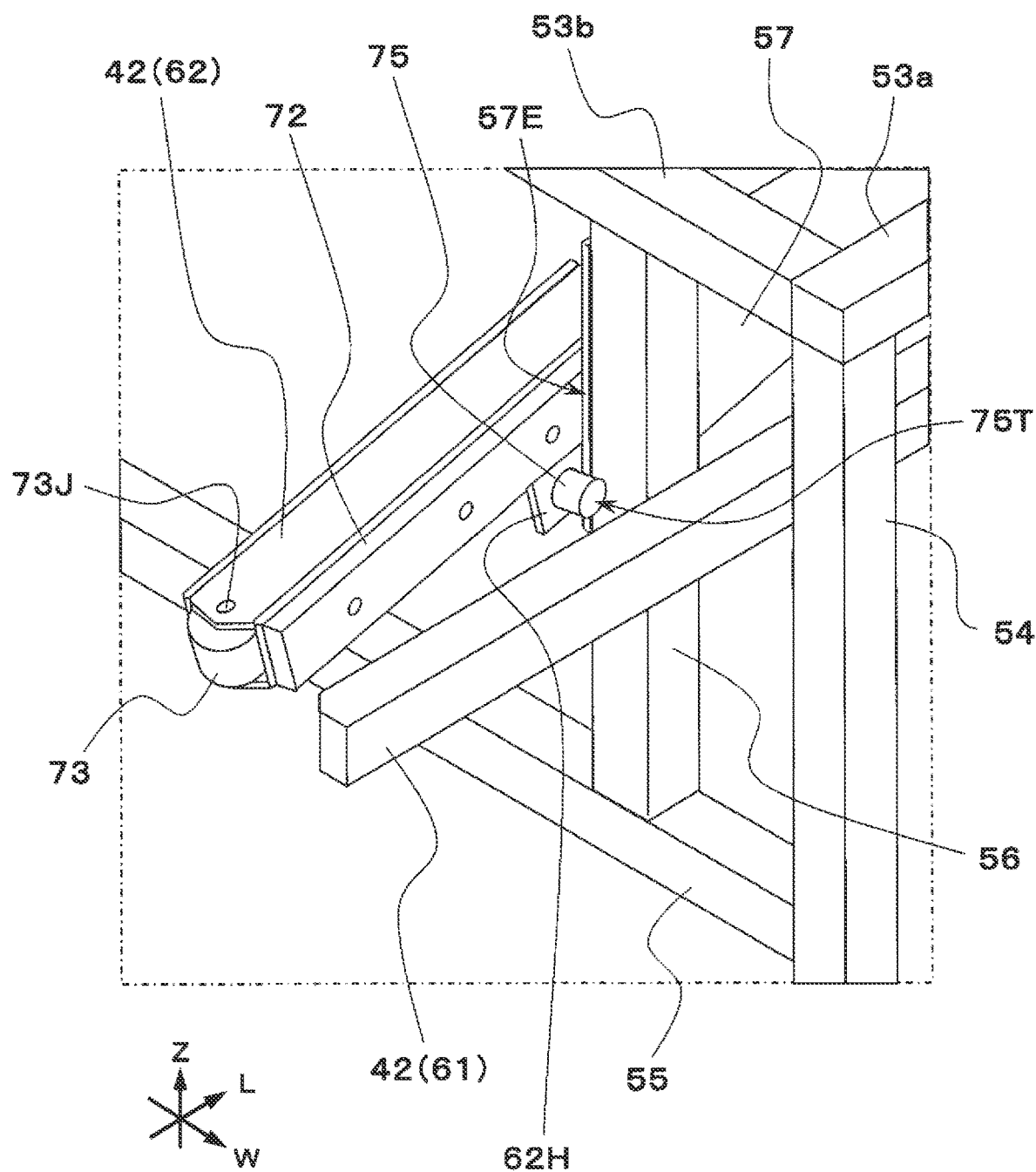
FIG. 13 is a perspective view showing a state in which the inner guide shown in FIG. 9A is locked by a lock pin at a projection position.

In addition, when the pressing of inner guide 62 is released from the state in which inner guide 62 slides rearward, inner guide 62 moves forward by self-weight (FIG. 9B to FIG. 9A) and returns to the projection position (FIG. 9A). When inner guide 62 returns to the projection position, lock pin 75 is located at the overhanging position by a biasing force of return spring 77 until then, and outer end 75T abuts on front edge 57E of guide attachment plate 57. Therefore, inner guide 62 is locked again (FIGS. 9A, 10, and 13).

As described above, in the present embodiment, each of left and right inner guides 62 located at the projection position is locked to main body 41 by lock pin 75 provided on inner guide 62, and when roller 73 provided at the tip end of inner guide 62 as an abutting member is pressed toward main body 41, lock pin 75 operates in a direction of releasing the lock and sliding of inner guide 62 to the storage position is possible.

In a case where data is to be transmitted to feeder carriage 10 by work device 1, feeder carriage 10 is brought close to main body 41 after connector 25 is placed in a posture to face connector part 41K. In this case, worker OP or automated guided vehicle 30 brings feeder carriage 10 close to main body 41.

Figure 15A:
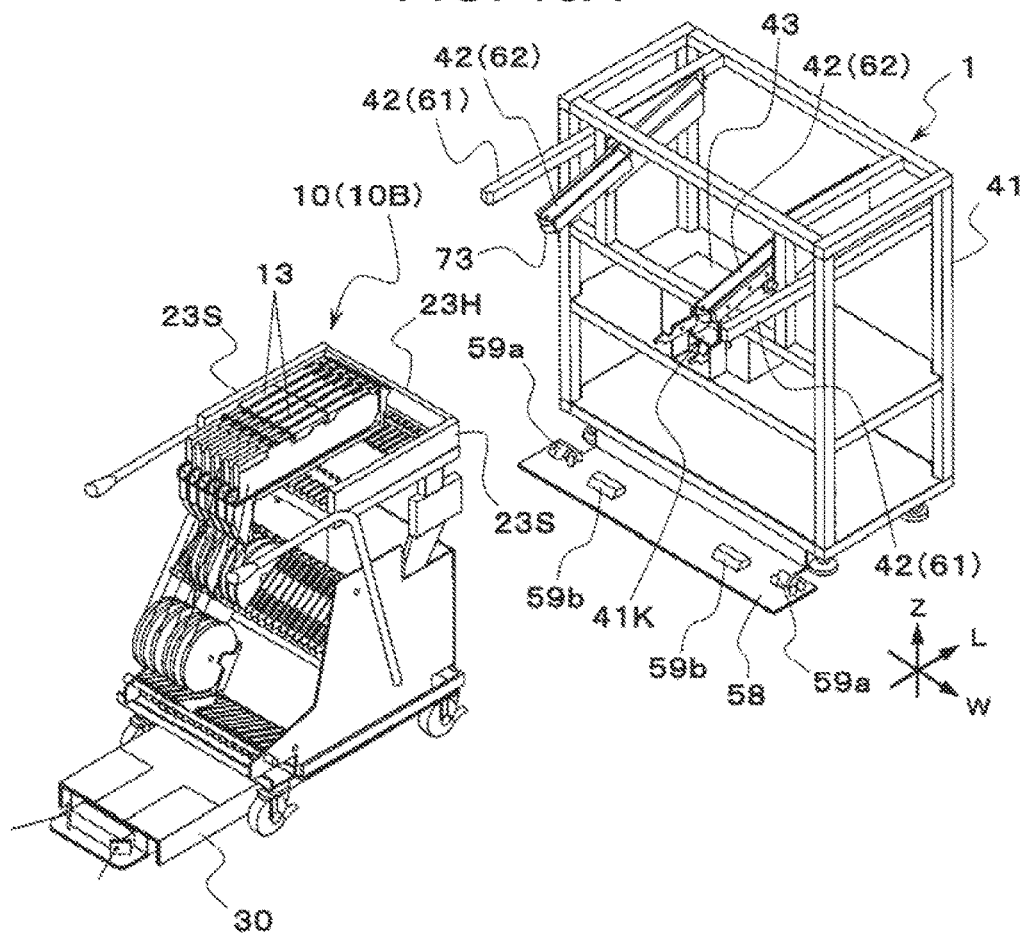
FIG. 15A is a perspective view showing the work device shown in FIG. 1 and the narrower carriage shown in FIG. 7B.
Figure 15B:
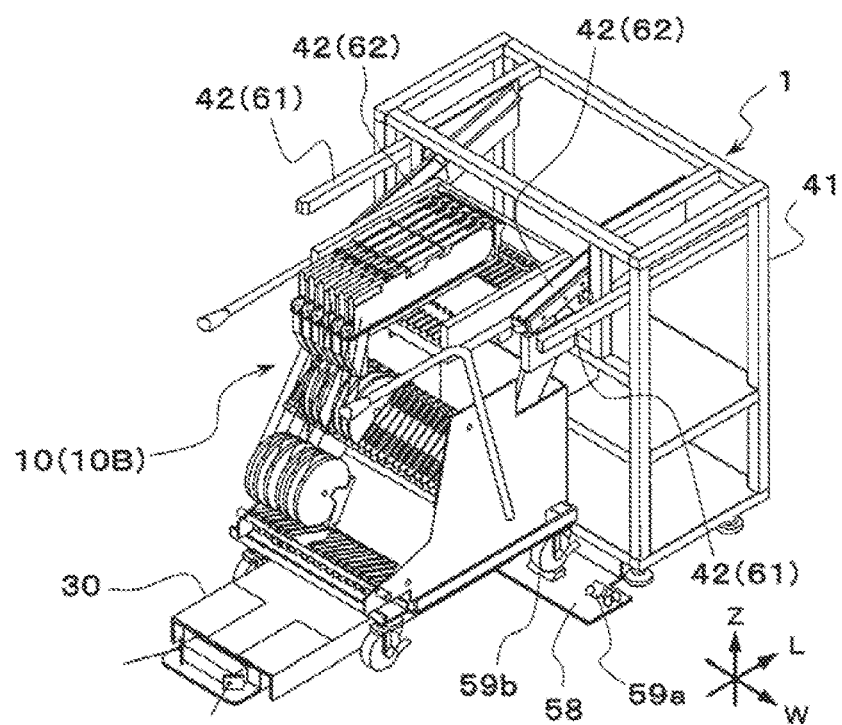
FIG. 15B is a perspective view showing a state in which the narrower carriage shown in FIG. 7B is connected to the work device shown in FIG. 1.
Figure 16A:
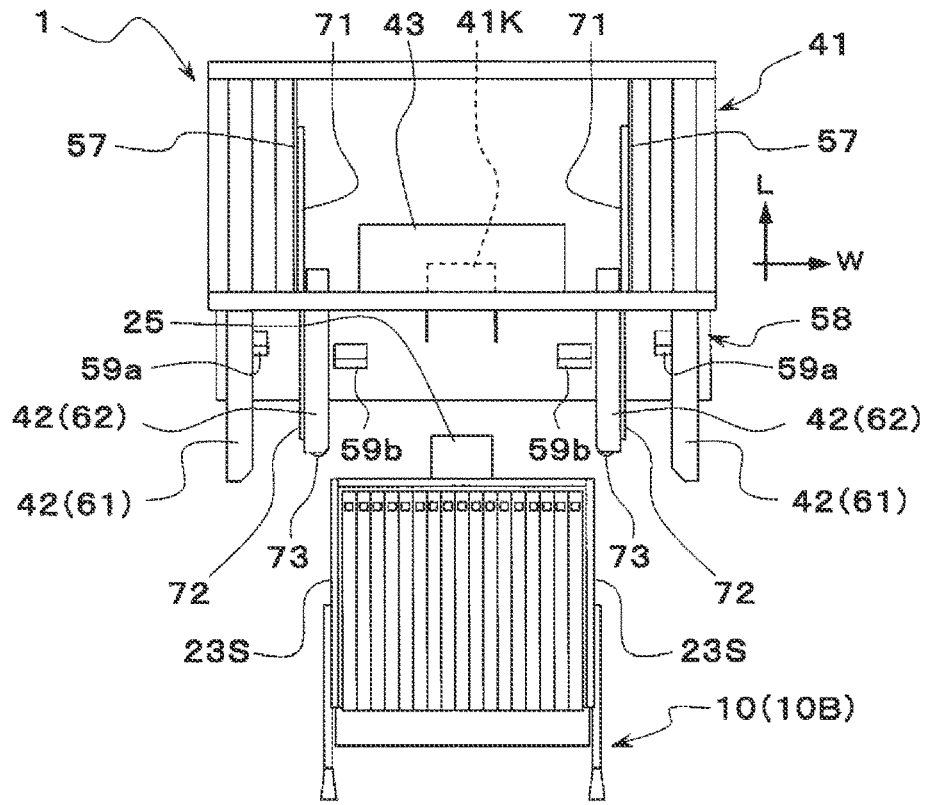
FIG. 16A is a plan view showing the work device shown in FIG. 1 and the narrower carriage shown in FIG. 7B.
Figure 16B:
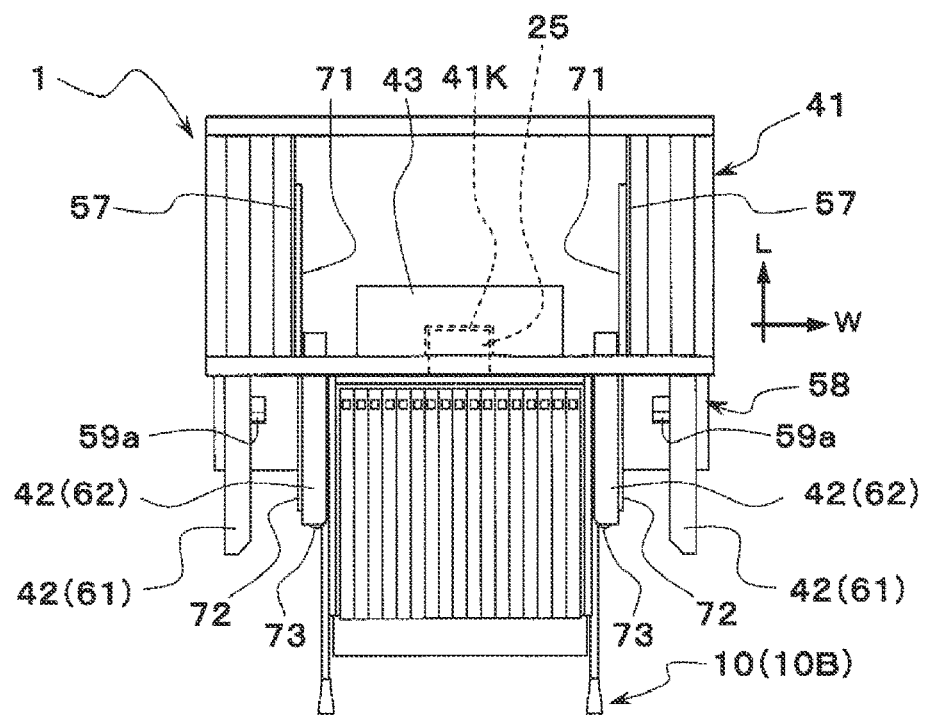
FIG. 16B is a plan view showing the state in which the narrower carriage shown in FIG. 7B is connected to the work device shown in FIG. 1.

Here, in a case where feeder carriage 10 that is brought close to main body 41 is narrower carriage 10B (FIG. 15A to FIG. 15B), further approach to main body 41 is restricted when rear left and right wheels 21 ride on left and right inner wheel stops 59b. At the same time, connector 25 is fitted to connector part 41K (FIG. 16A to FIG. 16B). When connector 25 is fitted to connector part 41K, narrower carriage 10B is in a state of being connected to work device 1 (FIGS. 15B and 16B). When narrower carriage 10B is brought close to main body 41, the left and right side surfaces thereof (outer surfaces of left and right side plates 23S) are guided by left and right inner guides 62 (FIG. 16A to FIG. 16B), so that connector 25 of narrower carriage 10B is reliably connected to connector part 41K of work device 1.

Figure 17A:
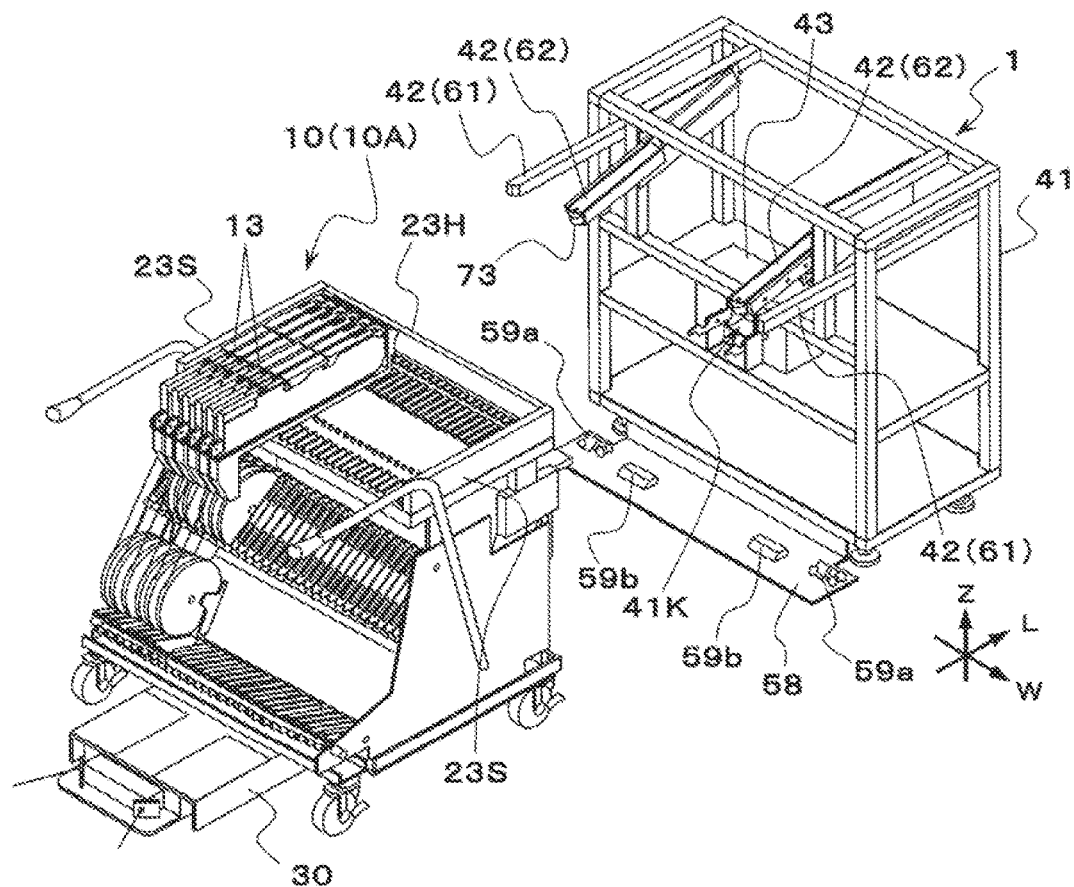
FIG. 17A is a perspective view showing the work device shown in FIG. 1 and the wider carriage shown in FIG. 7A.
Figure 17B:
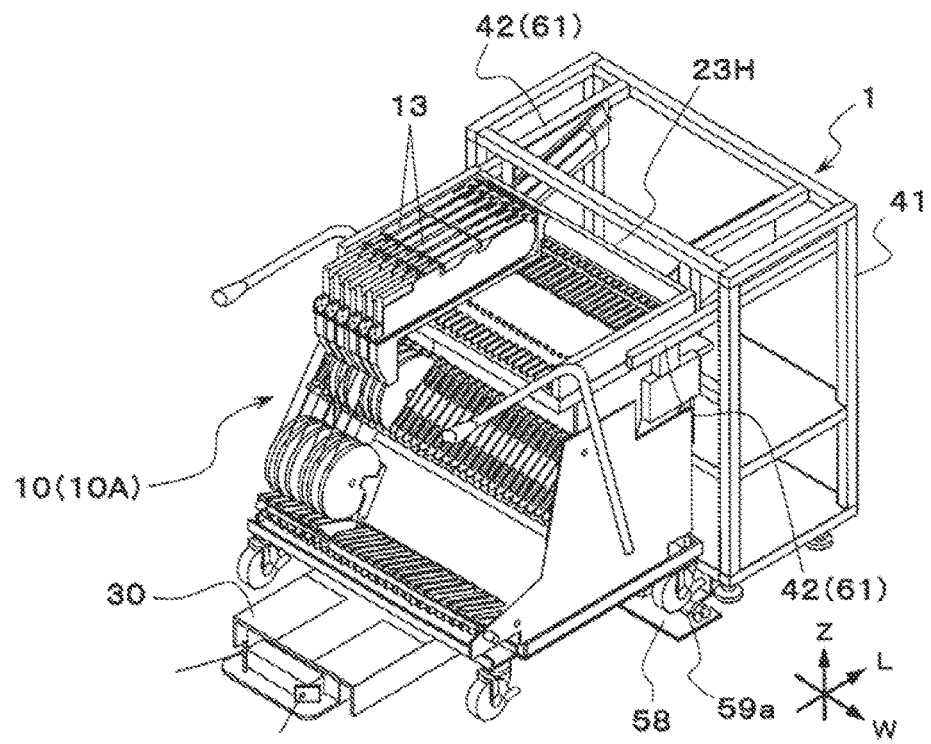
FIG. 17B is a perspective view showing a state in which the wider carriage shown in FIG. 7A is connected to the work device shown in FIG. 1.
Figure 18A:
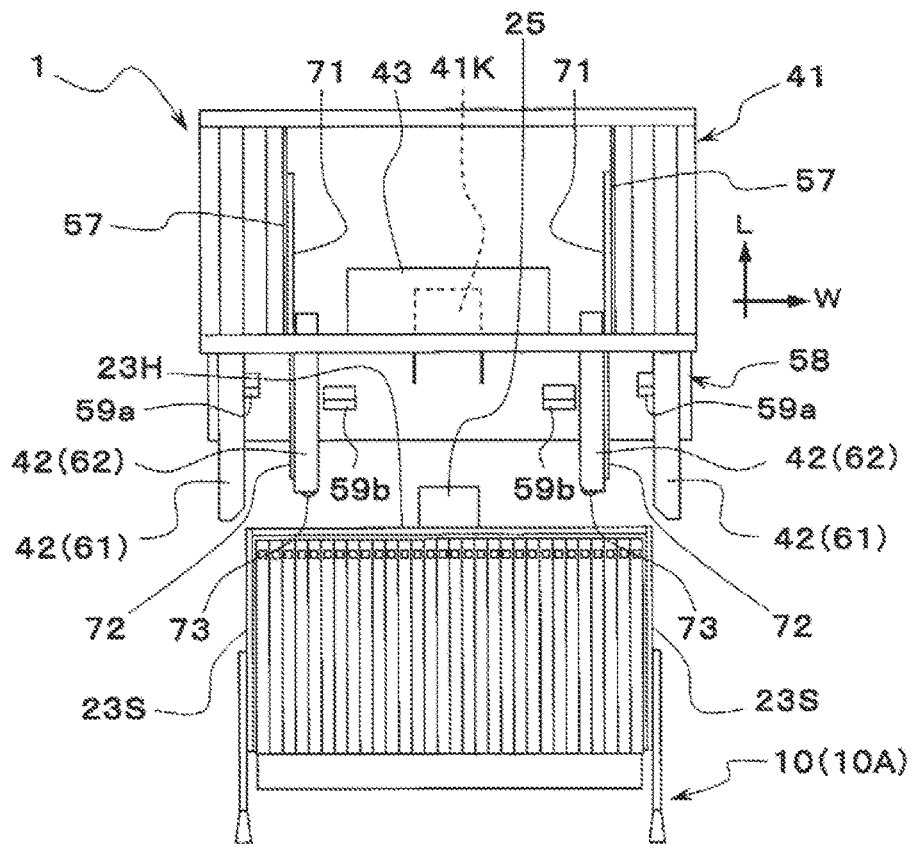
FIG. 18A is a plan view showing the work device shown in FIG. 1 and the wider carriage shown in FIG. 7A.
Figure 18B:
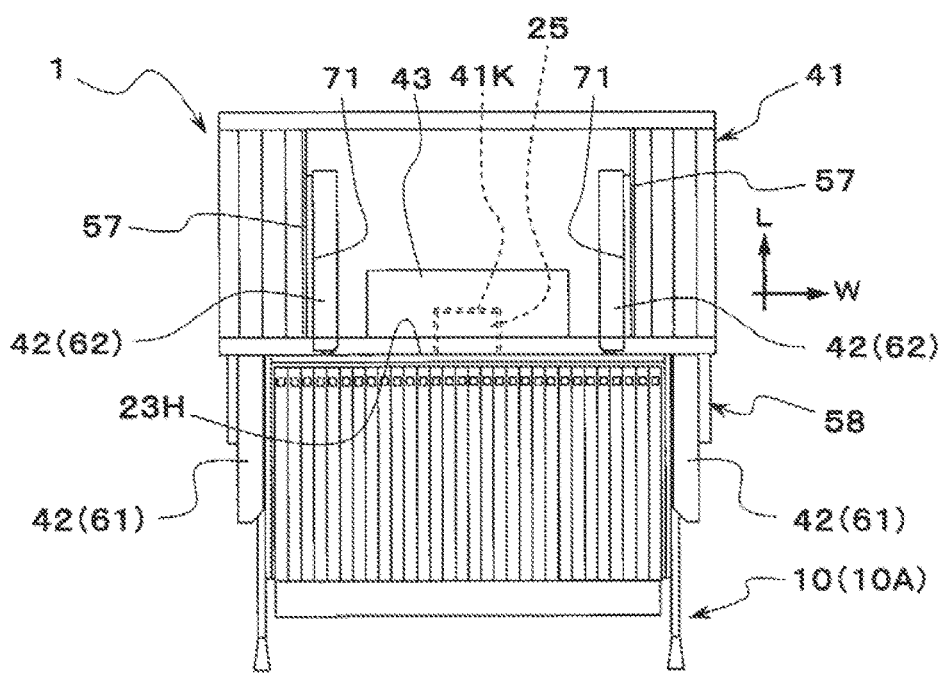
FIG. 18B is a plan view showing the state in which the wider carriage shown in FIG. 7A is connected to the work device shown in FIG. 1.

On the other hand, in a case where feeder carriage 10 that is brought close to main body 41 is wider carriage 10A (FIG. 17A to FIG. 17B), further approach to main body 41 is restricted when rear left and right wheels 21 ride on left and right outer wheel stops 59a. At the same time, connector 25 is fitted to connector part 41K (FIG. 18A to FIG. 18B). When connector 25 is fitted to connector part 41K, wider carriage 10A is in a state of being connected to work device 1 (FIGS. 17B and 18B). When wider carriage 10A is brought close to main body 41, the left and right side surfaces thereof (outer surfaces of left and right side plates 23S) are guided by left and right outer guides 61 (FIG. 18A to FIG. 18B), so that connector 25 of wider carriage 10A is reliably connected to connector part 41K of work device 1.

When feeder carriage 10 that is brought close to main body 41 is wider carriage 10A, wider carriage 10A moves to the side of main body 41 while pressing roller 73 provided at the tip end of each of left and right inner guides 62 rearward by back plate 23H. Accordingly, link mechanism 74 of each of left and right inner guides 62 operates so that outer end 75T of lock pin 75 is located at the non-overhanging position (FIGS. 12A to 12B), and the lock of left and right inner guides 62 to main body 41 is released. Therefore, left and right inner guides 62 are pressed by back plate 23H of wider carriage 10A to move rearward from the projection position (FIG. 9A to FIG. 9B), and are located at the storage position when connector 25 is fitted to connector part 41K. Therefore, left and right inner guides 62 do not hinder the progress of wider carriage 10A brought close to the side of main body 41.

When connector 25 is fitted to connector part 41K of work device 1 as described above, controller 10C of feeder carriage 10 and data transmitter 43 of work device 1 are electrically connected to each other, and data transmission from data transmitter 43 to the side of feeder carriage 10 is possible. When the data transmission becomes possible, data transmitter 43 waits for the operation by worker OP (or automatically) and transmits required data to feeder carriage 10. The data transmitted from data transmitter 43 is stored in a memory (not shown) of controller 10C of feeder carriage 10 (or parts feeder 13).

When the data transmission to the side of feeder carriage 10 by data transmitter 43 is completed, feeder carriage 10 is separated from main body 41. In this case, worker OP or automated guided vehicle 30 separates feeder carriage 10 from main body 41. When wider carriage 10A is separated from main body 41, each of left and right inner guides 62, which has been pressed rearward by wider carriage 10A until then and located at the storage position, slides forward by self-weight and returns to the projection position. Then, when inner guide 62 returns to the projection position, lock pin 75 projects to the overhanging position by return spring 77 and abuts on front edge 57E of guide attachment plate 57, so that inner guide 62 is locked to main body 41 again.

As described above, in work device 1 according to the present embodiment, connector 25 can be fitted to connector part 41K by bringing feeder carriage 10 close to main body 41 in a state of making connector 25 face connector part 41K. In this case, since the left and right side surfaces of feeder carriage 10 are guided by left and right guides 42 that are provided so as to project from main body 41, connector 25 is reliably fitted to connector part 41K. Therefore, there is no need for worker OP to manually connect the connectors to each other, which is conventionally required, and workability of the work of transmitting data to the side of feeder carriage 10 (data transmission work) can be improved.

Work device 1 according to the present embodiment includes two types of left and right guides 42 (outer guide 61 and inner guide 62) compatible with two types of feeder carriages 10 (wider carriage 10A and narrower carriage 10B) having different horizontal dimensions, and even in a case where whichever of the two types of feeder carriages 10 is brought close to main body 41, feeder carriage 10 is properly guided by guide 42 (outer guide 61 or inner guide 62) compatible with feeder carriage 10. Therefore, the work (data transmission) can be performed on the two types of feeder carriages 10 having different horizontal dimensions in spite of single work device 1, and workability of the data transmission work can also be improved in this aspect. In addition, since it is not necessary to prepare a plurality of work devices 1, it is advantageous in terms of cost. Furthermore, there is no need for worker OP to manually connect the connectors to each other, so that, in a case where feeder carriage 10 is transferred by automated guided vehicle 30 and feeder carriage 10 is automatically connected to and separated from base 11 of component mounter 2 and work device 1 (in an unmanned manner), a greater effect is obtained.

Although the embodiments of the present disclosure have been described so far, the present disclosure is not limited to those described above, and various modifications and the like can be made. For example, in the above-described embodiment, left and right guides 42 that guide the left and right side surfaces of feeder carriage 10 brought close to main body 41 have left and right outer guides 61 and left and right inner guides 62. This is because two types of feeder carriages 10 having different horizontal dimensions are work objects of work device 1. Accordingly, when there is one type of feeder carriage 10 as a work object, work device 1 needs only have one type of left and right guides 42 compatible with the horizontal dimension of feeder carriage 10.

INDUSTRIAL APPLICABILITY

Provided is a work device capable of improving workability of data transmission work for transmitting data to a feeder carriage.

REFERENCE MARKS IN THE DRAWINGS 1 work device
2 component mounter
10 feeder carriage
10A wider carriage
10B narrower carriage
10C controller
10S space below bottom
11 base
11C control device
11K, 25 connector
12 board transport device
13 parts feeder
13K component supply port
14 installing head
15 nozzle
21 wheel
22 base part
22F base-facing surface
23 feeder base
23H back plate
23S side plate
24 handle
30 automated guided vehicle
31 traveling body
32 top plate
41 main body
41K connector part
41L connector lock
42 guide
43 data transmitter
51 bottom floor
52 intermediate floor
53 upper frame
53a front-rear bar
53b horizontal bar
53c intermediate front-rear bar
54 pillar
55 horizontal crosspiece
56 vertical crosspiece
57 guide attachment plate
57E front edge 58 wheel stop base
59 wheel stop
59a outer wheel stop
59b inner wheel stop
61 outer guide
62 inner guide
62K elongated hole
62H lock pin guide
71 guide rail
72 slider
73 roller
73J roller support shaft
74 link mechanism
75 lock pin
75P lock pin attachment shaft member
75T outer end
76 spring pressing member
76F flange
77 return spring
81 main arm
81P swing support shaft
82 sub arm
82P pivot shaft

The invention claimed is:

1. A feeder carriage work device comprising:
a main body;
an electrical connector part provided in the main body and configured to be fitted to a connector of a feeder carriage;
a guide provided in the main body and guiding the feeder carriage so that the connector is fitted to the electrical connector part when the feeder carriage is brought close to the main body while making the connector face the electrical connector part; and
a data transmitter provided in the main body and transmitting data to the feeder carriage through the connector when the connector is fitted with the electrical connector part,
wherein the work device is compatible with a wider carriage and a narrower carriage having a horizontal dimension smaller than a horizontal dimension of the wider carriage as the feeder carriage,
the guide includes:
a pair of outer guides disposed on left and right sides of the main body, respectively, and configured to guide the wider carriage when the wider carriage is brought close to the main body; and
a pair of inner guides disposed on the left and right sides of the main body, respectively, and between the pair of outer guides, and configured to guide the narrower carriage when the narrower carriage is brought close to the main body, and
the pair of inner guides is pressed by the wider carriage and stored in the main body when the wider carriage is guided by the pair of outer guides to be brought close to the main body.

2. The feeder carriage work device according to claim 1, wherein the main body includes a pair of guide rails,
each of the pair of inner guides slides along a corresponding one of the pair of guide rails so as to be movable between a projection position and a storage position where the pair of inner guides projects from the main body at the projection position and the pair of inner guides is stored in the main body at the storage position, and
when the wider carriage is guided by the pair of outer guides to be brought close to the main body, a tip end of each of the pair of inner guides is pressed toward the main body by the wider carriage so that the pair of inner guides moves from the projection position to the storage position.

3. The feeder carriage work device according to claim 2,
wherein the pair of inner guides is inclined so that the tip end of each of the pair of inner guides is directed downward, and
in a state in which the tip end of each of the pair of inner guides is not pressed toward the main body, the pair of inner guides is located at the projection position by self-weight.

4. The feeder carriage work device according to claim 2,
wherein each of the pair of inner guides includes:
a lock pin configured to lock a corresponding one of the pair of inner guides with respect to the main body when the pair of inner guides are located at the projection position; and
an abutting member provided at the tip end of each of the pair of inner guides, and
when the abutting member is pressed toward the main body, the lock pin operates in a direction of releasing the corresponding one of the pair of inner guides, and each of the pair of inner guides is slidable to the storage position.

5. The feeder carriage work device according to claim 3,
wherein each of the pair of inner guides includes:
a lock pin configured to lock a corresponding one of the pair of inner guides with respect to the main body when the pair of inner guides are located at the projection position; and
an abutting member provided at the tip end of each of the pair of inner guides, and
when the abutting member is pressed toward the main body, the lock pin operates in a direction of releasing the corresponding one of the pair of inner guides, and each of the pair of inner guides is slidable to the storage position.

6. The feeder carriage work device according to claim 1,
wherein the main body includes a pair of guide rails,
each of the pair of inner guides slides along a corresponding one of the pair of guide rails so as to be movable between a projection position and a storage position where the pair of inner guides projects from the main body at the projection position and the pair of inner guides is stored in the main body at the storage position,
each of the pair of inner guides includes:
a lock pin configured to lock a corresponding one of the pair of inner guides with respect to the main body when the pair of inner guides are located at the projection position; and
an abutting member provided at a tip end of each of the pair of inner guides, and
when the abutting member is pressed toward the main body, the lock pin operates in a direction of releasing the corresponding one of the pair of inner guides, and each of the pair of inner guides is slidable to the storage position.

* * * * *